US012610775B2

(12) United States Patent
Sivaraman et al.

(10) Patent No.: US 12,610,775 B2
(45) Date of Patent: Apr. 21, 2026

(54) LID MOVING SYSTEMS AND METHODS FOR CHAMBERS AND CONTAINERS

(71) Applicant: ASM IP Holding B.V., Almere (NL)

(72) Inventors: Senthil Sivaraman, Phoenix, AZ (US);
Yevgeniy Rabinovich, Fremont, CA (US)

(73) Assignee: ASM IP Holding B.V., Almere (NL)

( * ) Notice: Subject to any disclaimer, the term of this patent is extended or adjusted under 35 U.S.C. 154(b) by 117 days.

(21) Appl. No.: 18/768,897

(22) Filed: Jul. 10, 2024

(65) Prior Publication Data

US 2025/0022729 A1 Jan. 16, 2025

Related U.S. Application Data

(60) Provisional application No. 63/526,759, filed on Jul. 14, 2023.

(51) Int. Cl.
*H01L 21/67* (2006.01)

(52) U.S. Cl.
CPC .............................. *H01L 21/67196* (2013.01)

(58) Field of Classification Search
CPC ................ B25J 9/042; H01L 21/67742; H01L 21/68742; H01L 2224/75754; H01L 21/6719; H01L 21/67196; H01L 21/67201; H01L 21/67207; H01L 21/68785; E05F 15/665; E06B 5/00; E06B 7/28
See application file for complete search history.

(56) References Cited

U.S. PATENT DOCUMENTS

| | | | |
|---|---|---|---|
| 3,961,723 A | 6/1976 | Eckel | |
| 4,566,730 A | 1/1986 | Knabe et al. | |
| 4,587,760 A | 5/1986 | Brissette | |
| 4,923,246 A | 5/1990 | Takahashi et al. | |
| 4,982,995 A | 1/1991 | Takahashi | |
| 5,503,450 A | 4/1996 | Miller | |
| 6,019,417 A | 2/2000 | Haberl | |
| 6,168,224 B1 | 1/2001 | Henn et al. | |
| 6,308,650 B1 | 10/2001 | Tsumiyama et al. | |

(Continued)

FOREIGN PATENT DOCUMENTS

| | | |
|---|---|---|
| BR | 112012011716 A2 | 3/2018 |
| DE | 4440814 A1 | 5/1996 |

(Continued)

*Primary Examiner* — Shawn M Braden
(74) *Attorney, Agent, or Firm* — Banner & Witcoff, Ltd.

(57) ABSTRACT

Lid moving systems and methods facilitate reliable and safe movement of lids for chambers. Such systems may include: (a) a base member; (b) side walls extending from the base member with each including a cam surface defined therein; (c) a lid mounting arm extending away from the base member; (d) a first pivotal connection system engaging the cam surfaces and pivotally engaging the lid mounting arm; (e) a traveler member including a recess or opening on a surface facing the base member; (f) a second pivotal connection system pivotally engaging the traveler member with the lid mounting arm; (g) a motor for moving the traveler member (causing movement of the lid mounting arm with respect to the side walls); and/or (h) a stopper mechanism extending into the recess or opening of the traveler member from a direction of the surface facing the base member when the lid is opened.

22 Claims, 13 Drawing Sheets

(56) References Cited

U.S. PATENT DOCUMENTS

Figure 1:
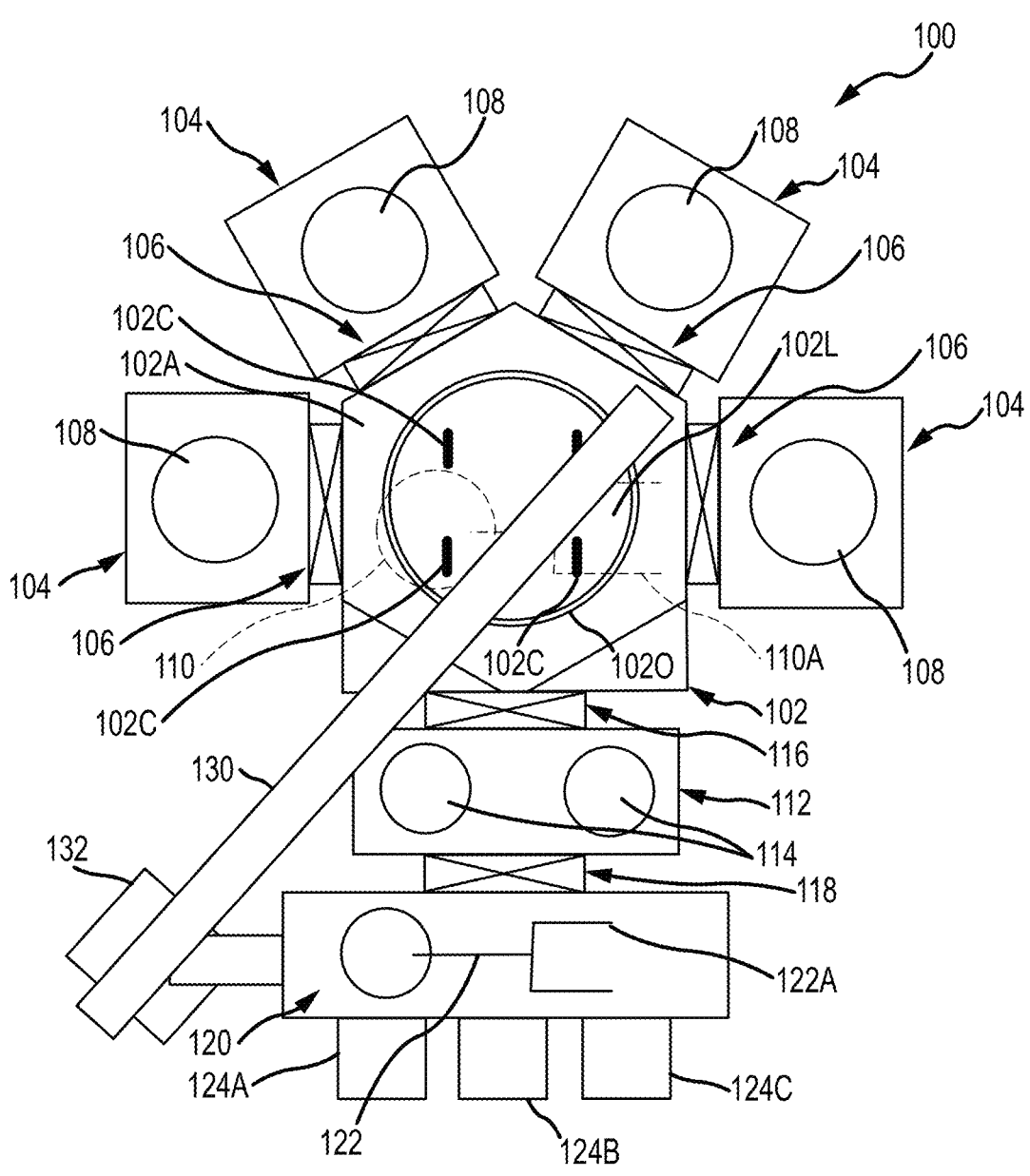

| | | | |
|---|---|---|---|
| 6,428,091 | B2 | 8/2002 | Ito et al. |
| 6,520,558 | B1 | 2/2003 | Katterloher et al. |
| 6,547,319 | B1 | 4/2003 | Huyer |
| 6,558,506 | B1 * | 5/2003 | Freeman ........... H01L 21/67167 |
| | | | 156/345.31 |
| 6,623,062 | B1 | 9/2003 | Hoffman |
| 6,814,392 | B1 | 11/2004 | Tomaszewski |
| 6,830,281 | B2 | 12/2004 | Hoffman |
| 6,834,463 | B2 | 12/2004 | Fukumoto et al. |
| 7,059,669 | B2 | 6/2006 | Oberheide |
| 7,083,217 | B2 | 8/2006 | Fukumoto et al. |
| 7,425,033 | B2 | 9/2008 | Regnier et al. |
| 7,451,888 | B2 | 11/2008 | Tanaka |
| 7,578,406 | B2 | 8/2009 | Katagiri |
| 7,703,623 | B2 | 4/2010 | Katagiri et al. |
| 8,172,303 | B2 | 5/2012 | Odoi et al. |
| 8,528,769 | B1 | 9/2013 | McKenna |
| 8,632,115 | B2 | 1/2014 | Coldre et al. |
| 9,233,785 | B2 | 1/2016 | Hirama et al. |
| 10,792,986 | B2 | 10/2020 | Knöpfle et al. |
| 11,505,050 | B2 | 11/2022 | Sawahata et al. |
| 2001/0030441 | A1 | 10/2001 | Wilde et al. |
| 2002/0190538 | A1 | 12/2002 | Lorentz |
| 2004/0185670 | A1 * | 9/2004 | Hamelin ................ C25D 11/02 |
| | | | 257/E21.252 |
| 2004/0205934 | A1 | 10/2004 | Derbis et al. |
| 2005/0218114 | A1 * | 10/2005 | Yue ..................... H01L 21/6719 |
| | | | 257/E21.252 |
| 2007/0228763 | A1 | 10/2007 | Duffy |
| 2008/0218043 | A1 | 9/2008 | Gianelo |
| 2009/0102225 | A1 | 4/2009 | Hanna et al. |
| 2010/0251519 | A1 | 10/2010 | Duffy |
| 2010/0294199 | A1 * | 11/2010 | Tran .................. H01L 21/68785 |
| | | | 118/723 R |
| 2011/0227363 | A1 | 9/2011 | Smith et al. |
| 2016/0082817 | A1 | 3/2016 | Mulholland et al. |
| 2016/0367073 | A1 * | 12/2016 | Smith ..................... A47J 36/34 |
| 2018/0273145 | A1 | 9/2018 | Pugh |
| 2021/0262257 | A1 | 8/2021 | Stranger et al. |
| 2024/0157783 | A1 | 5/2024 | Kaneko et al. |

FOREIGN PATENT DOCUMENTS

| | | |
|---|---|---|
| DE | 102017212396 B4 | 12/2023 |
| EP | 0895493 B1 | 1/2002 |
| EP | 1294585 B1 | 1/2007 |
| EP | 1767726 B1 | 10/2007 |
| EP | 1669234 B1 | 7/2008 |
| EP | 2768375 A1 | 8/2014 |
| IN | 2382/DELNP/2014 A | 3/2015 |
| JP | H0646739 B2 | 6/1994 |
| WO | 2013/059459 A1 | 4/2013 |

* cited by examiner

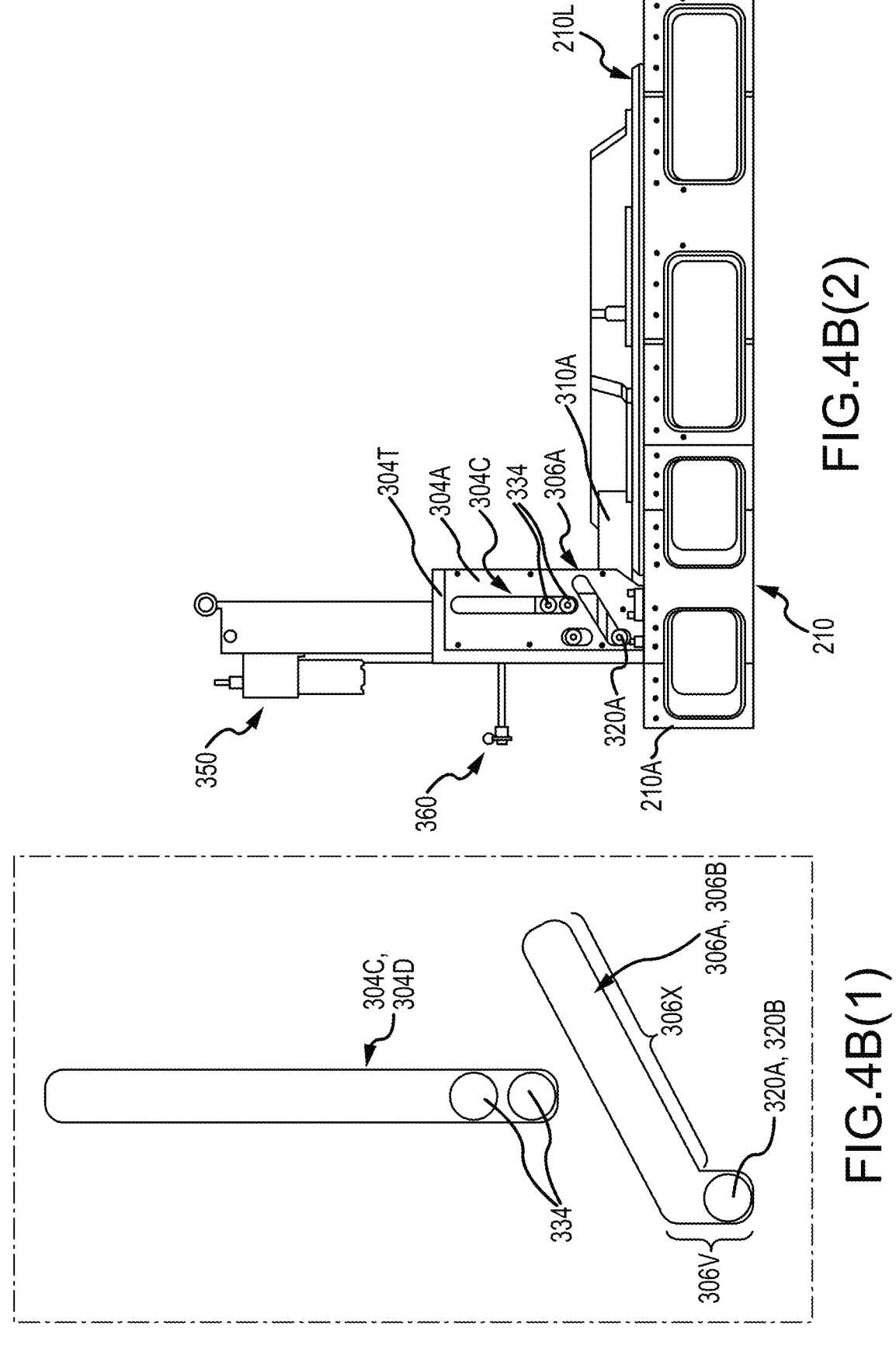
FIG.4B(2)
FIG.4B(1)

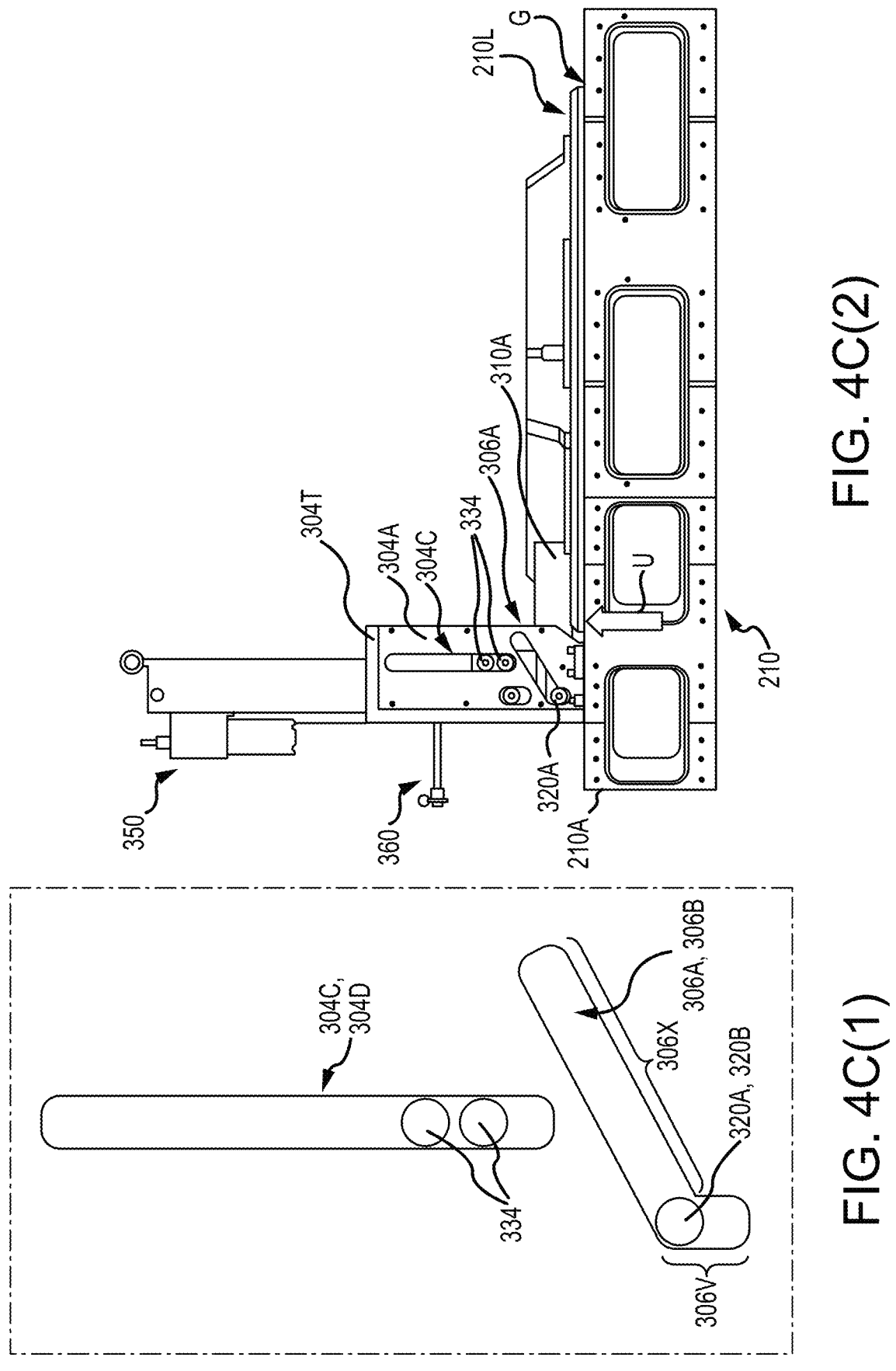
FIG. 4C(2)
FIG. 4C(1)

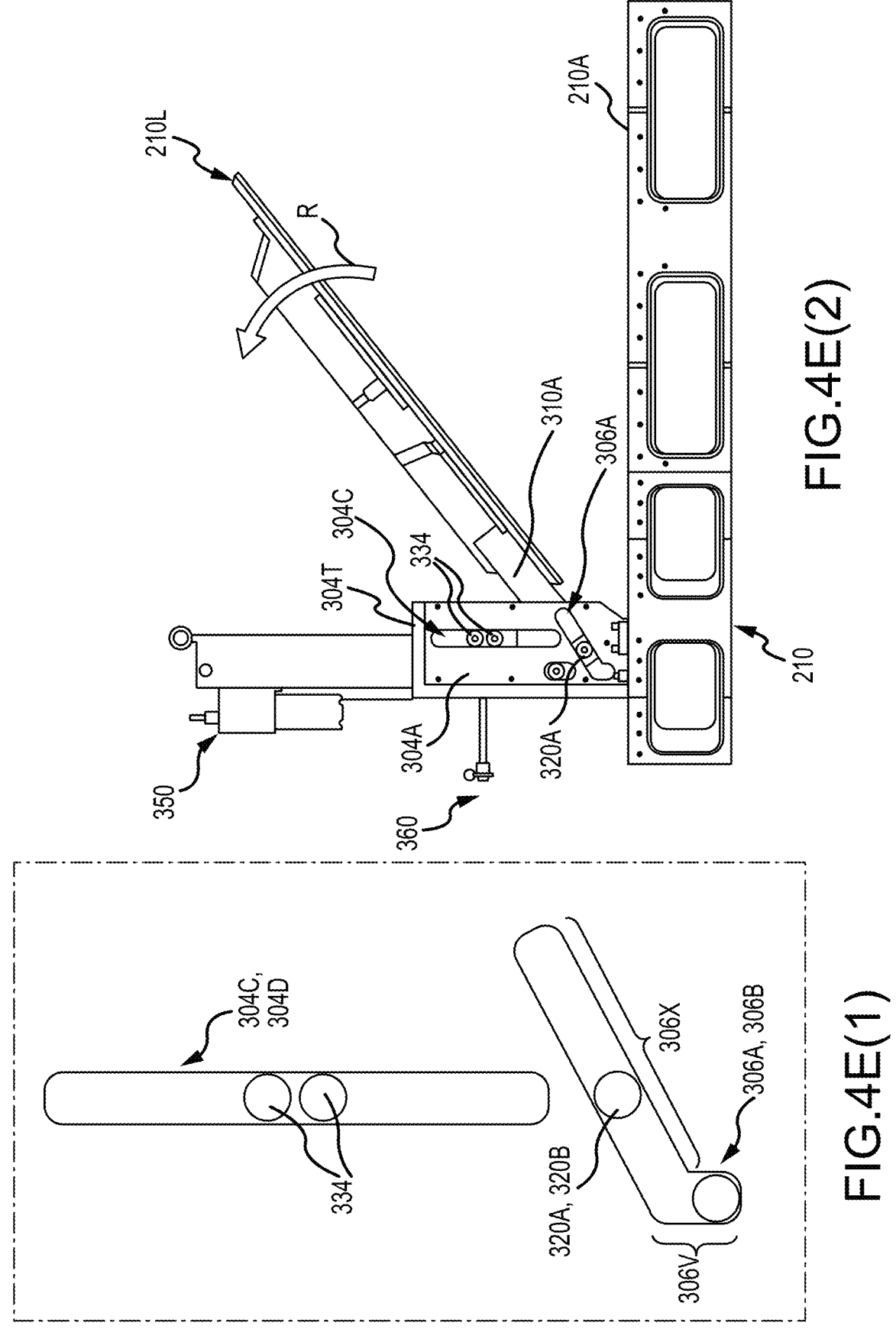
FIG.4E(2)
FIG.4E(1)

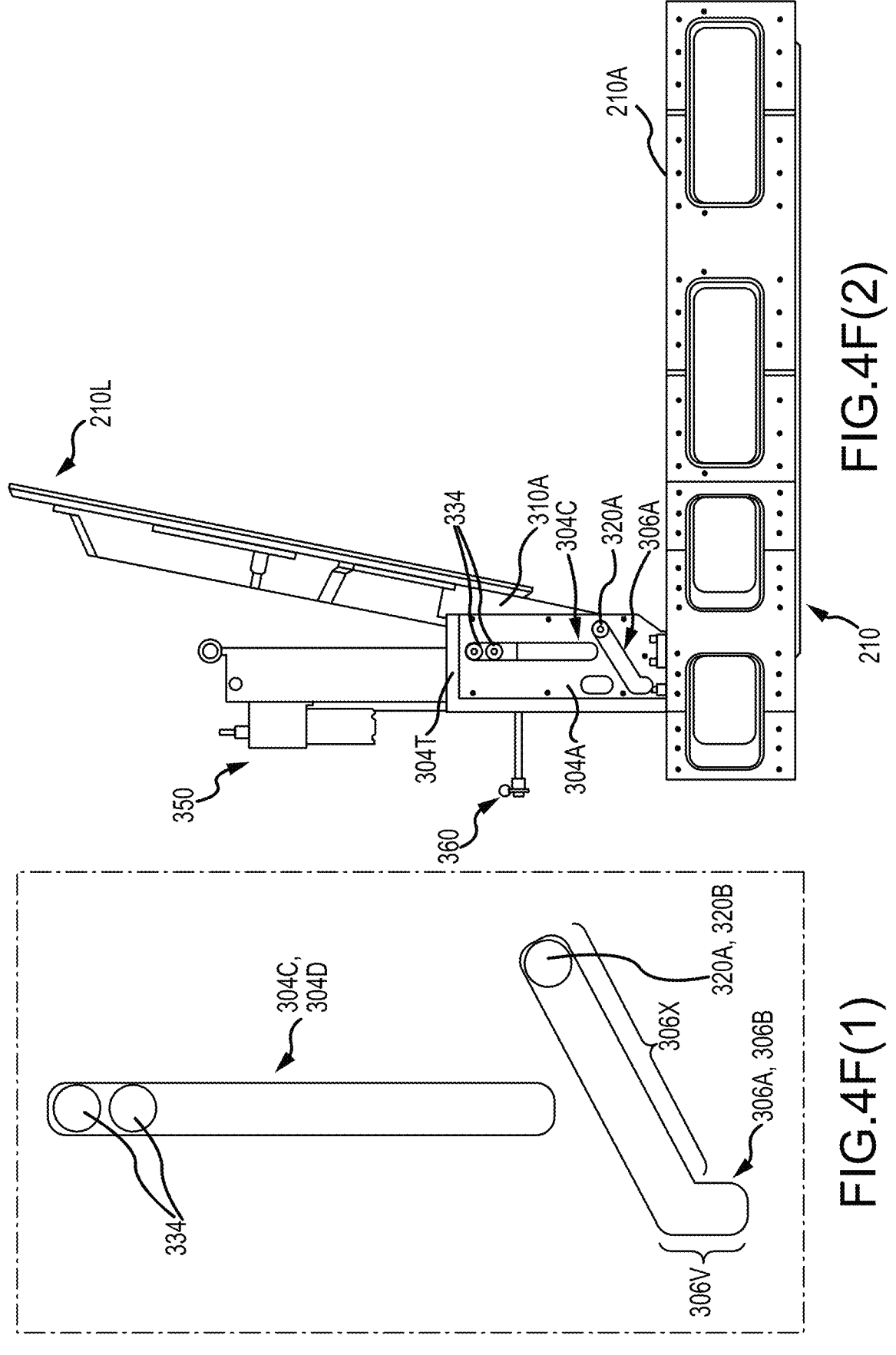
FIG.4F(2)
FIG.4F(1)

LID MOVING SYSTEMS AND METHODS FOR CHAMBERS AND CONTAINERS

CROSS-REFERENCE TO RELATED APPLICATION(S)

This application claims the benefit of U.S. Provisional Application 63/526,759 filed on Jul. 14, 2023, the entire contents of which are incorporated herein by reference.

FIELD OF THE DISCLOSURE

The present disclosure relates generally to systems and methods for opening and closing interior chambers to enclosures (e.g., modules used in substrate processing systems, other chambers or containers, etc.). Some more particular aspects of this technology relate to lid moving systems, enclosures (e.g., substrate handling chamber modules, substrate processing chamber modules, reactor chambers, storage containers, other containers, etc.) including such lid moving systems, and/or methods of moving a lid (e.g., to open and close access openings to such enclosures).

BACKGROUND OF THE DISCLOSURE

Material layers are commonly deposited onto substrates during fabrication of semiconductor devices, such as during fabrication of integrated circuits and electronic devices. Material layer deposition generally is accomplished by supporting a substrate within a substrate processing chamber arrangement, heating the substrate to a desired deposition temperature, and flowing one or more material layer precursors through the chamber arrangement and across the substrate. As the precursor flows across the substrate, the material layer progressively develops onto the surface of the substrate, typically according to the temperature of the substrate and environmental conditions within the chamber arrangement.

Existing substrate processing systems 100 include "cluster type" systems of the type generally shown in FIG. 1. Such substrate processing systems 100 include a substrate handling chamber 102 that operatively connects with two to four substrate processing chambers 104 via gate valves 106. Each substrate processing chamber 104 is equipped to receive a substrate on a substrate support 108 that holds the substrate during processing (e.g., during material layer deposition as described above).

The substrate handling chamber 102 includes robotic arm 110 used to move substrates into and out of the various substrate processing chambers 104 through the gate valves 106. In use, a gate valve 106 is opened, an end effector 110A of the robotic arm 110 extends through the open gate valve 106 to insert a substrate into or remove a substrate from an interior chamber of the substrate processing chamber 104 (e.g., placing a substrate on or taking a substrate off the substrate support 108). Once the robotic arm 110 is retracted from the substrate processing chamber 104, the gate valve 106 is closed, thereby sealing the substrate processing chamber 104 from the substrate handling chamber 102. Then, other desired actions can take place in the substrate processing chamber 104 and/or the substrate handling chamber 102.

FIG. 1 further shows that this substrate processing system 100 includes a load-lock module 112. The load-lock module 112 is connected with the substrate handling chamber 102 by gate valve 116. The load-lock module 112 includes substrate holding components 114 for holding substrates on the way into the substrate handling chamber 102 for further processing and on the way out of the substrate handling chamber 102 (after processing is complete). The end effector 110A of robotic arm 110 moves through the gate valve 116 (when opened) to move substrates from the load-lock module 112 into the substrate handling chamber 102 (for layer deposition and other processing) and from the substrate handling chamber 102 into the load-lock module 112 (after processing is completed). The load-lock module 112 and gate valve 116 keep the substrates isolated from the environment of the substrate handling chamber 102 until the conditions (e.g., temperature, pressure, content of atmosphere, etc.) within the substrate handling chamber 102 are ready for the substrate(s) to be inserted.

The load-lock module 112 further is coupled with an equipment front end module 120 via another gate valve 118. The equipment front end module 120 includes a robotic arm 122. The end effector 122A of that robotic arm 122 moves through the gate valve 118 (when opened) to move substrates from the equipment front end module 120 into the load-lock module 112 (for layer deposition and/or other processing) and from the load-lock module 112 into the equipment front end module 120 (after processing is completed). The robotic arm 122 of the equipment front end module 120 also picks up new substrates for processing from one of the load ports 124A-124C and returns processed substrates to one of the load ports 124A-124C, e.g., to be transported to another location for further processing.

Substrate handling chambers 102 of this type typically include a chamber body 102A (e.g., in which the robotic arm 110 is housed) having an access opening 1020 that is covered and sealed by a lid 102L. The lid 102L is removable to allow cleaning and other maintenance to the substrate handling chamber 102, the robotic arm 110, etc.

Removal of the lid 102L of the substrate handling chamber 102 generally requires a hoisting mechanism due to size, weight, and/or shape of the lid 102L. The lifting mechanism typically includes a gantry 130 that is built to span the lid 102L of the substrate handling chamber 102 and a hoist 132. The hoist 132 connects with the lid 102L (e.g., at connectors 102C) and exerts sufficient upward force to break the seal between the lid 102L and the interior chamber of the substrate handling chamber 102. The force required to break the seal can be significant, even after the substrate handling chamber 102 is vented. The gantry 130 enables the hoisted lid 102L to be shifted away from the chamber body 102A (by moving the hoist 132 and attached lid 102L along gantry 130 to a location away from the remainder of the substrate processing system 100) to provide access to the interior of the substrate handling chamber 102 and the robotic arm 110.

Conventional semiconductor production systems and methods of this type generally have been acceptable for their intended purpose, but there is room for improvement. Gantry-hoist arrangements of the types described above require space and may require periodic certification and inspection, thereby increasing cost of ownership and/or complicating service of the substrate processing system.

SUMMARY OF THE DISCLOSURE

Aspects of this technology relate to systems and methods for opening and closing interior chambers to enclosures (e.g., modules used in substrate processing systems, other chambers or containers, etc.). Some more particular aspects and examples of this technology relate to lid moving systems, enclosures (e.g., substrate handling chamber modules, substrate processing chamber modules, reactor chambers, storage containers, other containers, etc.) including such lid moving systems, and/or methods of moving a lid, e.g., to open and close access openings to such enclosures.

Lid moving systems and methods in accordance with examples of this technology facilitate reliable and safe movement of lids for chambers. Such systems may include one or more of: (a) a base member; (b) side walls extending from the base member with each including a cam surface defined therein; (c) a lid mounting arm extending away from the base member; (d) a first pivotal connection system engaging the cam surfaces and pivotally engaging the lid mounting arm; (e) a traveler member including a recess or opening on a surface facing the base member; (f) a second pivotal connection system pivotally engaging the traveler member with the lid mounting arm; (g) a motor for moving the traveler member (causing movement of the lid mounting arm with respect to the side walls); and/or (h) a stopper mechanism extending into the recess or opening of the traveler member from a direction of the surface facing the base member when the lid is opened.

Lid moving system in accordance with at least some examples of this technology may include one or more of: (a) a base member having a first side and a second side; (b) a first side wall extending from the first side of the base member, the first side wall including a first cam surface defined therein; (c) a second side wall extending from the second side of the base member, the second side wall including a second cam surface defined therein; (d) a lid mounting arm extending in a direction away from the base member; (e) a first pivotal connection system engaging the first cam surface and the second cam surface and pivotally engaging the lid mounting arm; (f) a traveler member including a recess or opening on a surface facing the base member; (h) a second pivotal connection system pivotally engaging the traveler member with the lid mounting arm; (i) a motor for moving the traveler member, wherein movement of the traveler member causes movement of the lid mounting arm with respect to the first side wall and the second side wall; and/or (j) a stopper mechanism configured to removably extend into the recess or opening of the traveler member from a direction of the surface facing the base member when the traveler member is at a lid open position.

In addition to one or more of the features described above, or as an alternative, the base member in lid moving systems in accordance with this technology may include a through hole aperture, wherein the stopper mechanism is removably engageable with the recess or opening of the traveler member through the through hole aperture of the base member when the traveler member is at the lid open position.

In addition to one or more of the features described above, or as an alternative, lid moving systems in accordance with this technology may include a heating element configured to heat at least a portion of the lid mounting arm.

In addition to one or more of the features described above, or as an alternative, in some examples of this technology, each of the first cam surface and the second cam surface may have a vertical cam segment at a first end and an angled cam segment extending upward and away from the vertical cam segment and away from the base member.

In addition to one or more of the features described above, or as an alternative, in some examples of this technology, each of the first side wall and the second side wall may include a tracking slot to define a direction of motion for the traveler member, wherein the traveler member includes one or more tracking elements extending into the tracking slots.

In addition to one or more of the features described above, or as an alternative, in some examples of this technology, the lid mounting arm may include a first end and a lid-engaging portion, wherein the first pivotal connection system is located at the first end and the second pivotal connection system is spaced from the first end toward the lid-engaging portion.

Additional aspects of this technology relate to enclosures. Such enclosures may include one or more of: (a) a main body member including a top, a bottom, and one or more sidewalls connecting the top and the bottom, wherein the top includes an opening providing access to an internal chamber defined in part by the main body member; (b) a lid sealingly attachable to the top of the main body member to close the internal chamber; and/or (c) a lid moving system engaged with the main body member, wherein the lid moving system includes one or more of: (i) a base member having a first side and a second side, wherein the base member includes a surface that faces in a direction away from the main body member, (ii) a first side wall extending from the first side of the base member, the first side wall including a first cam surface defined therein, (iii) a second side wall extending from the second side of the base member, the second side wall including a second cam surface defined therein, (iv) a lid mounting arm extending in a direction away from the base member, wherein the lid mounting arm is engaged with the lid at a first outer edge location of the lid, (v) a first pivotal connection system engaging the first cam surface and the second cam surface and pivotally engaging the lid mounting arm, (vi) a traveler member including a recess or opening on a surface facing the base member, (vii) a second pivotal connection system pivotally engaging the traveler member with the lid mounting arm, (viii) a motor for moving the traveler member, wherein movement of the traveler member causes movement of the lid mounting arm and the lid with respect to the main body member, and/or (ix) a stopper mechanism configured to extend into the recess or opening of the traveler member from a direction of the surface facing the base member when the traveler member is at a lid open position.

In addition to one or more of the features described above, or as an alternative, in some example enclosures in accordance with this technology, the base member may include a through hole aperture, and wherein the stopper mechanism is removably engageable with the recess or opening of the traveler member through the through hole aperture of the base member when the traveler member is at the lid open position.

In addition to one or more of the features described above, or as an alternative, some example enclosures in accordance with this technology may include a control system for controlling the motor, wherein the control system generates signals to stop operation of the motor when the lid is at the lid open position.

In addition to one or more of the features described above, or as an alternative, some example enclosures in accordance with this technology may include a heating element configured to heat at least one of (i) the lid at least at the first outer edge location or (ii) at least a portion of the lid mounting arm.

In addition to one or more of the features described above, or as an alternative, in some example enclosures in accordance with this technology, each of the first cam surface and the second cam surface may include a vertical cam segment at a first end and an angled cam segment extending upward and away from the vertical cam segment and away from the base member.

In addition to one or more of the features described above, or as an alternative, in some example enclosures in accordance with this technology, each of the first cam surface and the second cam surface may be configured such that, during a lid opening event: (i) the lid moving system initially lifts the lid upward at the first outer edge location until a seal between the lid and the main body member is unsealed and then (ii) the lid pivots upward away from the main body member about the first pivotal connection system and the second pivotal connection system.

In addition to one or more of the features described above, or as an alternative, in some example enclosures in accordance with this technology, each of the first side wall and the second side wall may include a tracking slot to define a direction of motion for the traveler member, wherein the traveler member includes one or more tracking elements extending into the tracking slots.

In addition to one or more of the features described above, or as an alternative, in some example enclosures in accordance with this technology, the lid mounting arm may include a first end and a lid-engaging portion, wherein the first pivotal connection system is located at the first end and the second pivotal connection system is spaced from the first end toward the lid-engaging portion.

In addition to one or more of the features described above, or as an alternative, in some example enclosures in accordance with this technology, the main body member may comprise a substrate handling chamber for moving substrates from the internal chamber to one or more substrate processing chambers.

Additional aspects of this technology relate to methods of moving a lid with respect to a main body member of an enclosure that include one or more of: (a) engaging a lid moving system with the lid, wherein the lid moving system includes: (i) a base member having a surface that faces in a direction away from the main body member, (ii) a lid mounting arm extending in a direction away from the base member, wherein the engaging includes engaging the lid mounting arm with the lid at a first outer edge location of the lid, (iii) a traveler member including a recess or opening on a surface facing the base member, (iv) a pivotal connection system pivotally engaging the traveler member with the lid mounting arm, and (v) a motor for moving the traveler member, wherein movement of the traveler member causes movement of the lid mounting arm and the lid; (b) operating the motor to initially apply a lifting force to the lid at the first outer edge location; (c) after the lifting force is applied, operating the motor to apply a rotational force to rotate the lid upward on the lid mounting arm in a direction away from the main body member to a lid open position; and (d) inserting a stopper mechanism into the recess or opening of the traveler member from a direction of the surface facing the base member to prevent the lid from moving from the lid open position.

In addition to one or more of the features described above, or as an alternative, in some example methods in accordance with this technology, the inserting may include inserting the stopper mechanism through a through hole opening provided in the base member and into the recess or opening of the traveler member.

In addition to one or more of the features described above, or as an alternative, in some example methods in accordance with this technology, the lifting force will break a sealed engagement between the lid and the main body member at the first outer edge location.

In addition to one or more of the features described above, or as an alternative, in some example methods in accordance with this technology, application of the lifting force to break the sealed engagement may include deforming a shape of the lid at the first outer edge location.

In addition to one or more of the features described above, or as an alternative, some example methods in accordance with this technology may include heating at least one of (i) the lid at least at the first outer edge location or (ii) at least a portion of the lid mounting arm prior to operating the motor to apply the lifting force.

In addition to one or more of the features described above, or as an alternative, in some example methods in accordance with this technology, the main body member may comprise a substrate handling chamber for moving substrates from the main body member to one or more substrate processing chambers.

In addition to one or more of the features described above, or as an alternative, some example methods in accordance with this technology may include a lid closing step.

In addition to one or more of the features described above, or as an alternative, some example methods in accordance with this technology may include, with the lid in the lid open position, one or more of: (i) removing the stopper mechanism from the recess or opening of the traveler member; and/or (ii) operating the motor to initially rotate the lid downward on the lid mounting arm in a direction toward the main body member and then move the lid downward to the main body member.

This summary is provided to introduce a selection of concepts relating to this technology in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 2:
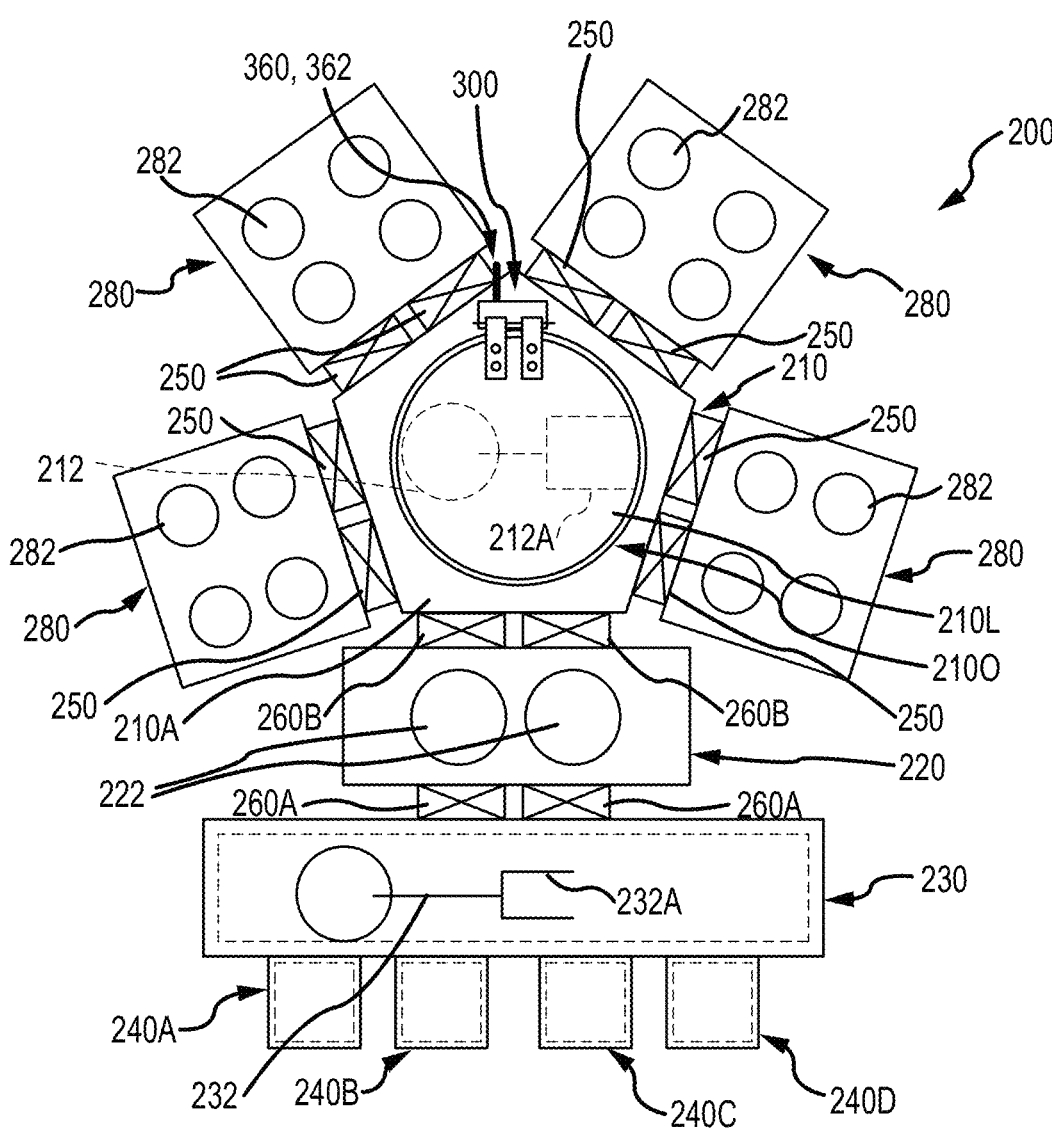

FIG. 1 is a schematic view of a basic, prior art cluster type substrate processing system;

FIG. 2 provides a schematic overhead view of an example substrate processing system in accordance with some examples of this technology;

FIGS. 3A-3G provide various views illustrating features of a lid moving system incorporated with an enclosure (e.g., a substrate handling chamber) in accordance with some examples of this technology; and FIGS. 4A-4F(2) provide various views illustrating various features of lid moving operations in accordance with some examples of this technology.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION

Reference now will be made to the drawings wherein like reference numerals identify similar structural features or aspects of the subject disclosure.

FIG. 2 illustrates an example substrate processing system 200 that includes lid moving systems 300 and/or uses lid moving methods in accordance with some examples of this technology. More specifically, FIG. 2 schematically illustrates an overhead view of a substrate processing system 200 (e.g., a "cluster type" semiconductor processing system) having one or more "enclosures" that may include lid moving systems 300 and/or use lid moving methods in accordance with aspects of this technology. This specific example substrate processing system 200 includes a lid moving system 300 in accordance with examples of this technology engaged with substrate handling chamber 210 (which includes a main body 210A, such as a main body member or chamber including a top, a bottom, one or more sidewalls connecting the top and the bottom, and a top access opening 2100). FIG. 2 further illustrates lid moving system 300 in accordance with this technology connected with a lid 210L covering access opening 2100 to an internal chamber of substrate handling chamber 210 in this "cluster type" substrate processing system 200.

Substrate processing system 200 shown in FIG. 2 includes: (a) substrate handling chamber 210 including a first robotic arm 212 having an end effector 212A and the lid moving system 300; (b) load-lock module 220 connected at one edge or facet of substrate handling chamber 210; and (c) equipment front end module 230 that includes a second robotic arm 232 having an end effector 232A connected with an opposite side of the load-lock module 220 from the substrate handling chamber 210. The equipment front end module 230 may include or connect with a nitrogen gas source for providing a nitrogen gas atmosphere within the equipment front end module 230. The equipment front end module 230 receives new substrates (e.g., wafers) for processing into the substrate processing system 200 and discharges processed substrates from the substrate processing system 200 via one or more loading ports 240A-240D (moving the substrates between the loading port(s) 240A-240D and the load-lock module 220 using second robotic arm 232). While four loading ports 240A-240D are shown in the example of FIG. 2, more or fewer loading ports may be provided in other examples of this technology.

The substrate handling chamber 210 is connected with multiple substrate processing chambers 280. Substrates are transferred into the substrate processing chambers 280 where one or more layers of material are deposited onto a surface of the substrate and/or other desired substrate processing takes place. FIG. 2 shows each substrate processing chamber 280 including four substrate supports 282 onto which substrates can be placed during processing. More or fewer substrates supports 282 may be provided in each substrate processing chamber 280 (e.g., the substrate processing chambers 280 may be dual chamber modules (DCM) or quad chamber modules (QCM)). Substrate processing chambers 280 in accordance with some examples of this technology may include another four substrate supports 282 located vertically beneath the four substrate supports 282 shown in the top view of FIG. 2. Each of the substrate processing chambers 280 may have the same structures or one or more of the substrate processing chambers 280 may have a different structure from other substrate processing chambers 280 present.

The substrate handling chamber 210 is connected with its respective substrate processing chambers 280 via one or more gate valves 250. While two gate valves 250 are shown connecting substrate handling chamber 210 with each of their respective substrate processing chambers 280, more or fewer gate valves 250 may be provided with each substrate processing chamber 280, in other examples of this technology. Substrate processing chambers 280 in accordance with some examples of this technology may be connected with substrate handling chamber 210 by another two gate valves 250, e.g., located vertically beneath the two gate valves 250 shown in the top view of FIG. 2. When closed, the gate valves 250 sealingly separate the substrate handling chamber 210 from its connected substrate processing chambers 280 (so that independent atmospheric conditions may be maintained in each chamber). When open, the gate valves 250 provide an opening (e.g., a substrate transfer slot) through which the end effector 212A of first robotic arm 212 can extend to move substrates into and out of the substrate processing chamber 280. The openings through the gate valves 250 align with substrate transfer slots provided in the substrate processing chambers 280 and the substrate handling chamber 210 to enable substrates to be moved between the substrate processing chambers 280 and the substrate handling chamber 210 through the gate valves 250. Each of gate valves 250 may have the same structures or one or more of the gate valves 250 may have a different structure from other gate valves 250 present.

One face of the load-lock module 220 connects with the equipment front end module 230 by one or more gate valves 260A (two shown in FIG. 2), and the opposite face of the load-lock module 220 connects with the substrate handling chamber 210 by one or more gate valves 260B. The load-lock module 220 further includes one or more substrate supports 222 (two shown in FIG. 2) for holding substrates while they wait to be moved into the equipment front end module 230 or the substrate handling chamber 210. When closed, the gate valves 260A, 260B sealingly separate the load-lock module 220 from the equipment front end module 230 and the substrate handling chamber 210 (so that independent atmospheric conditions may be maintained in each chamber). When open, the gate valves 260A provide an opening (e.g., a substrate transfer slot) through which the end effector 232A of second robotic arm 232 can extend to move substrates into and out of the equipment front end module 230. The openings through the gate valves 260A align with substrate transfer slots provided in the equipment front end module 230 and the load-lock module 220 to enable substrates to be moved between the equipment front end module 230 and the load-lock module 220 through gate valves 260A. When open, the gate valves 260B provide an opening (e.g., a substrate transfer slot) through which the end effector 212A of first robotic arm 212 can extend to move substrates into and out of the substrate handling chamber 210. The openings through the gate valves 260B align with substrate transfer slots provided in the substrate handling chamber 210 and the load-lock module 220 to enable substrates to be moved between the substrate handling chamber 210 and the load-lock module 220 through gate valves 260B. Each of gate valves 260A, 260B may have the same structure or one or more of the gate valves 260A, 260B may have a different structure from other gate valves 260A, 260B present.

Figure 3A:
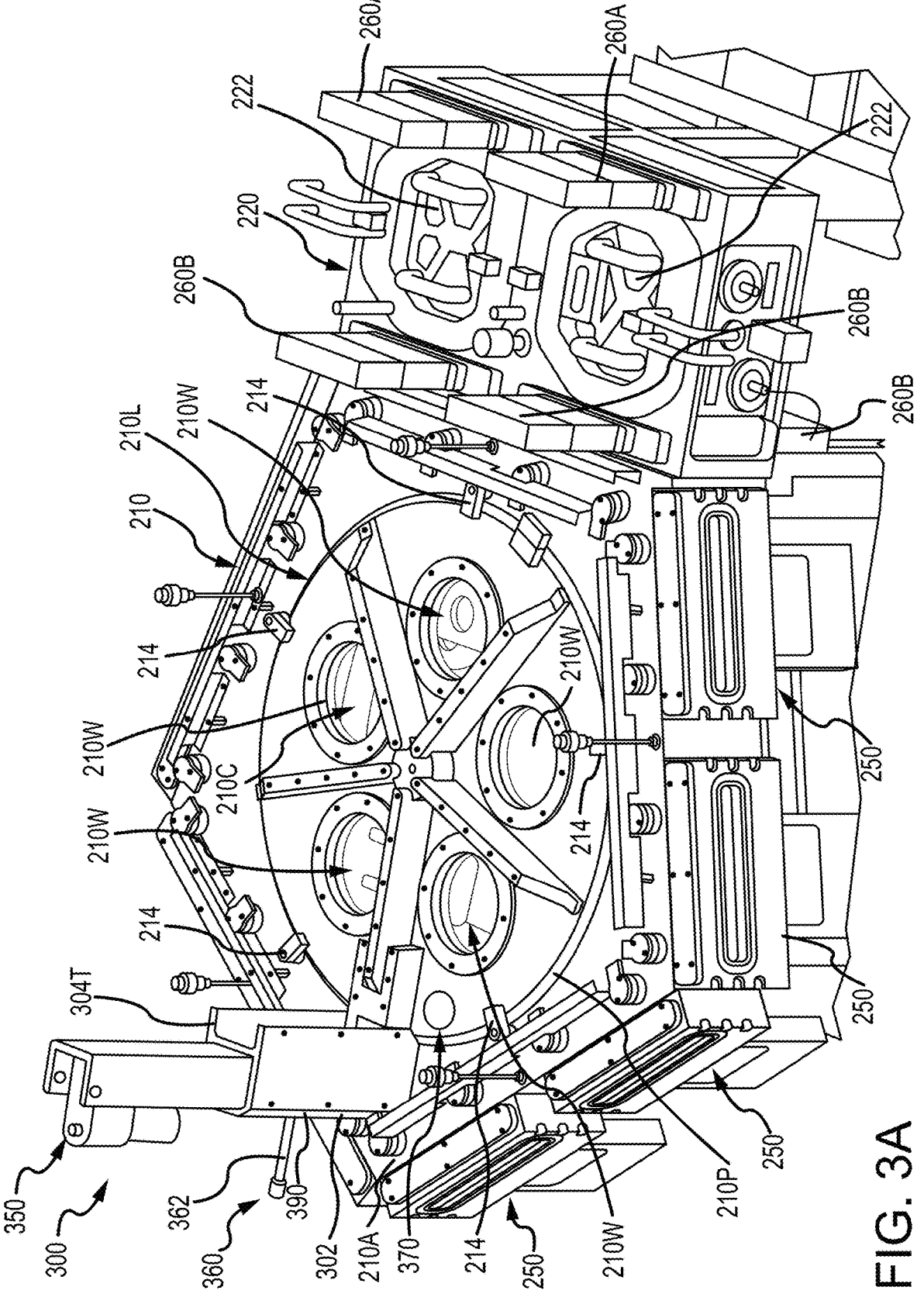
Figure 3B:
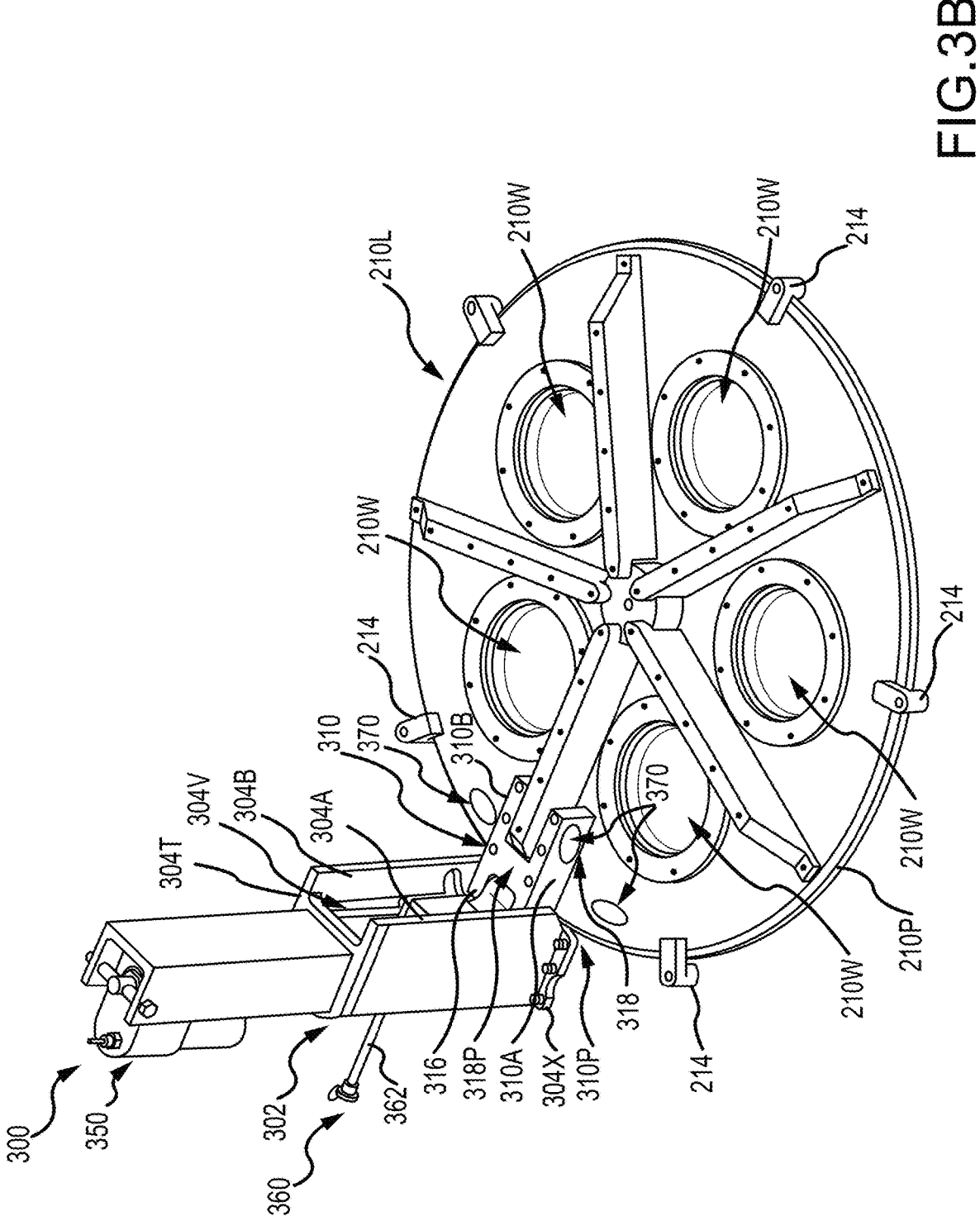
Figures 3C, 3D:
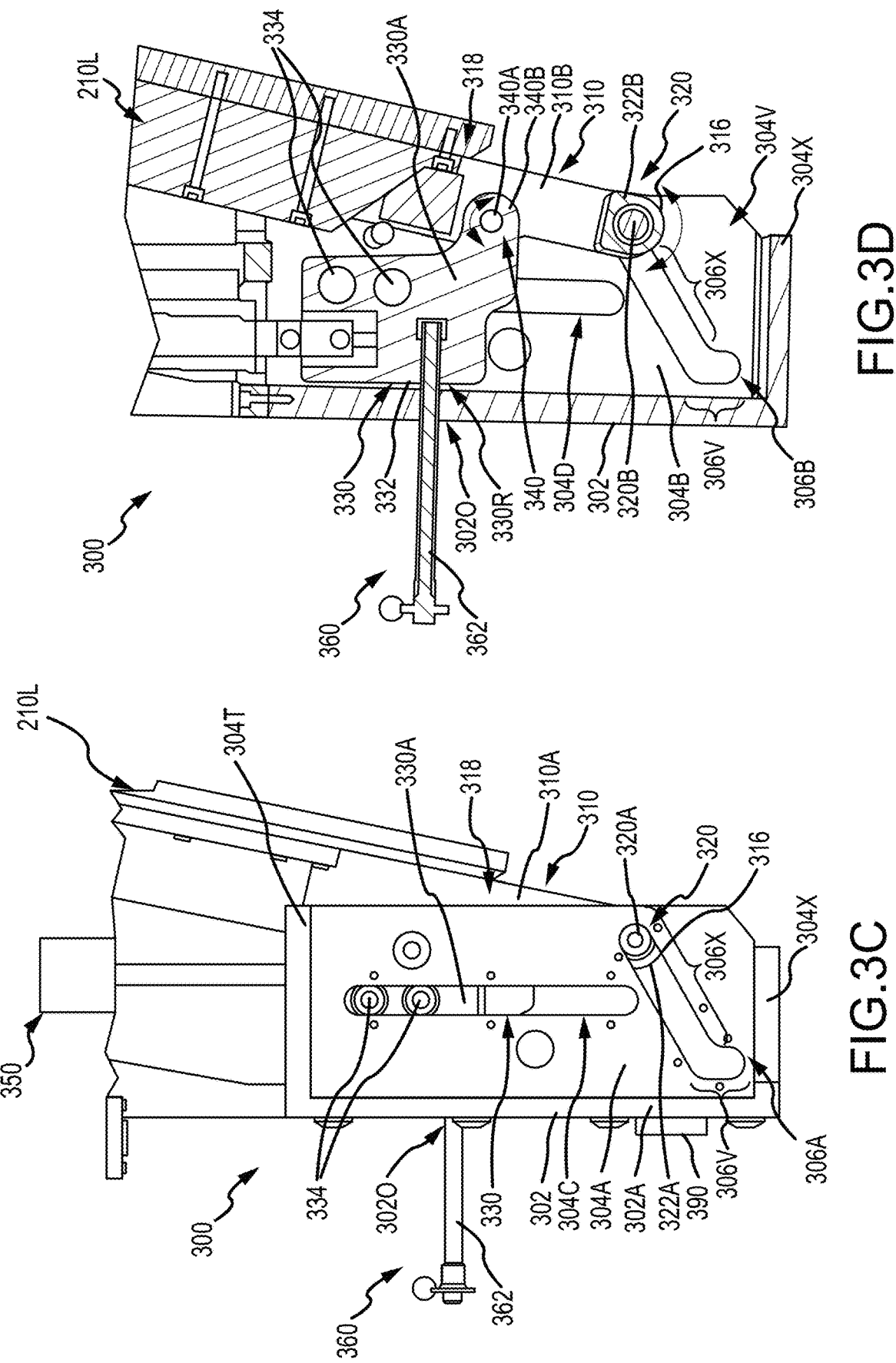
Figure 3E:
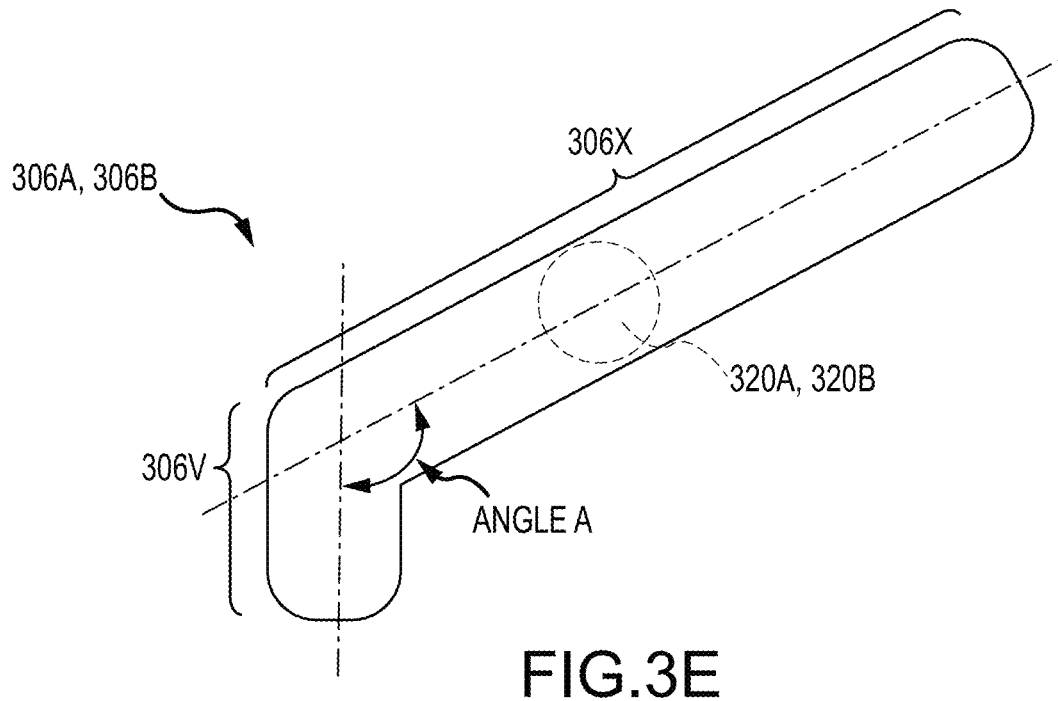
Figure 3F:
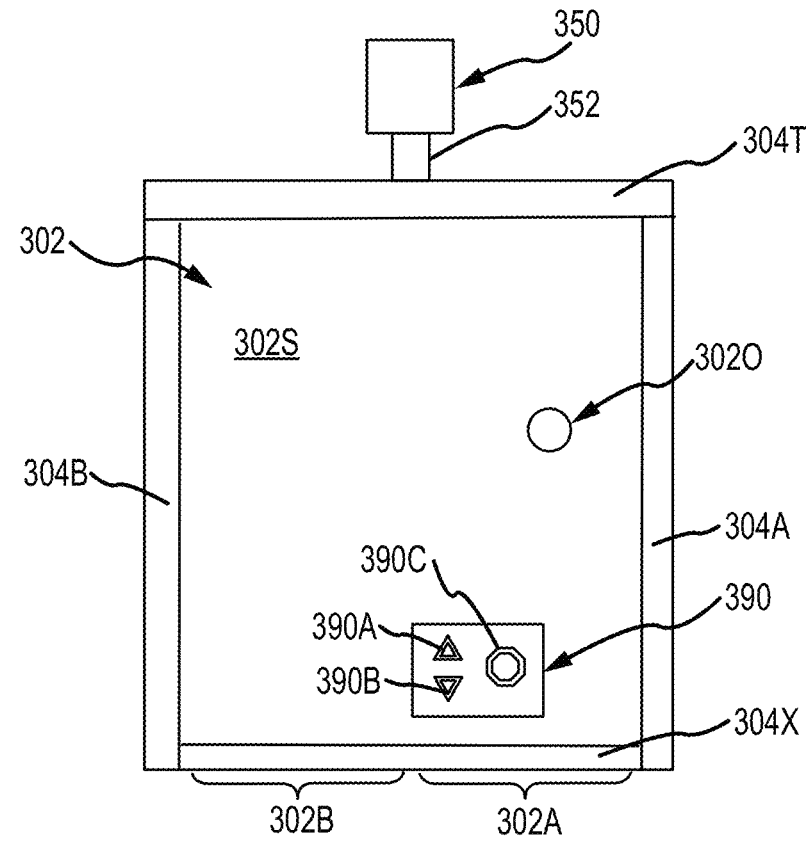
Figure 3G:
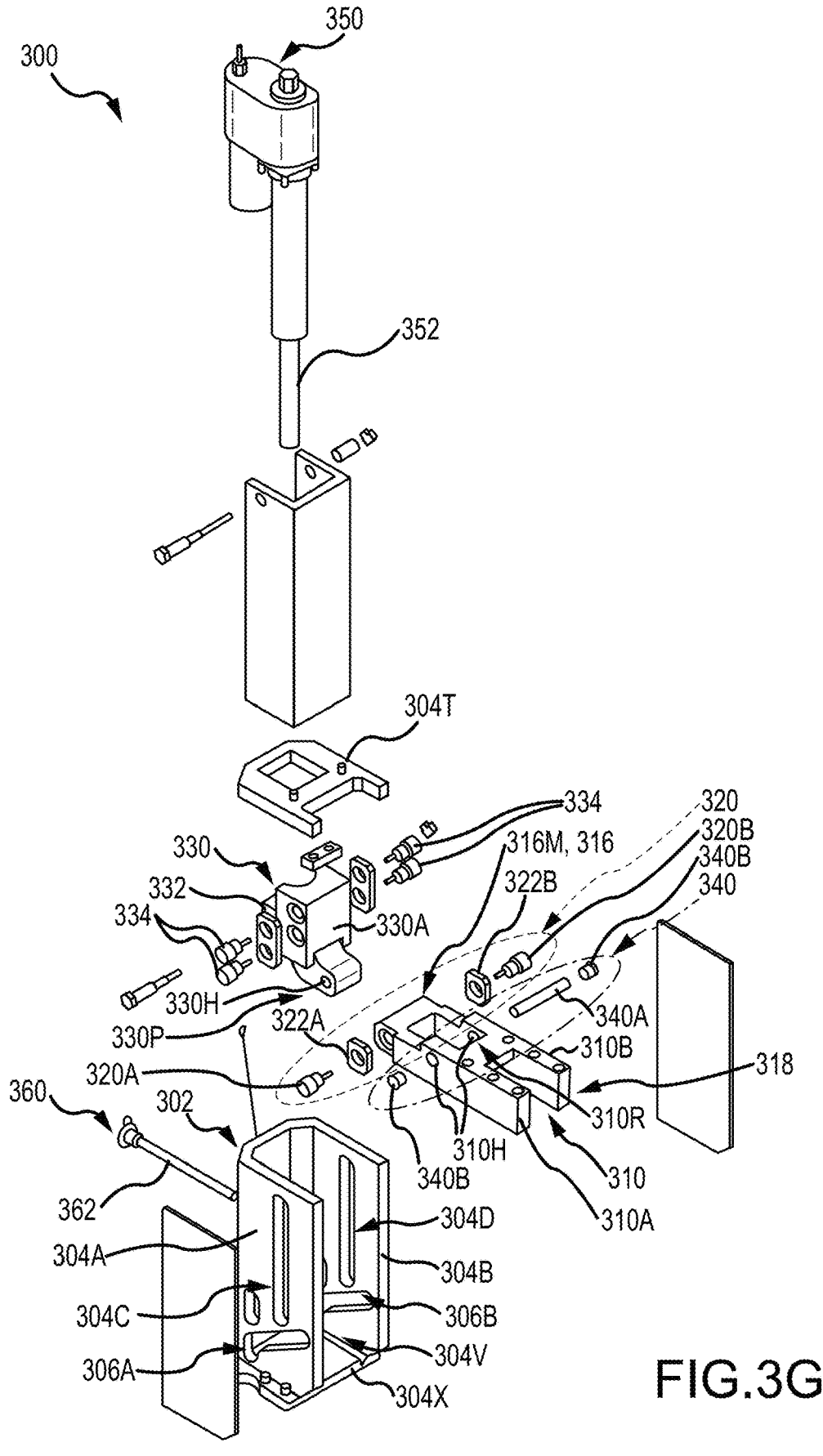

As noted above, the substrate handling chamber 210 of this example is equipped with a lid moving system 300 in accordance with aspects of this technology. This example lid moving system 300 will be discussed in more detail below in conjunction with FIGS. 3A-3G. FIG. 3A provides a perspective view of the load-lock module 220 and substrate handling chamber 210 (including lid moving system 300) of substrate processing system 200 with the substrate processing chambers 280 and equipment front end module 230 removed. FIG. 3B provides a perspective view of a lid moving system 300 with attached lid 210L in accordance with some examples of this technology. FIGS. 3C and 3D show a side view and a sectional view, respectively, of portions of the lid moving system 300 in a "lid open" position in accordance with examples of this technology. FIG. 3E provides additional details regarding cam surfaces in accordance with some examples of this technology. FIG. 3F provides a face-on view of a portion of a "tower" of the lid moving system 300. FIG. 3G provides an exploded view of the lid moving system 300 in accordance with some examples of this technology to illustrate its various parts. Where the same reference number is used in FIGS. 3A-3G as used in FIG. 2 (or other figures), the same or similar parts are being referenced, and much of the overlapping description may be omitted.

As shown in FIG. 3A, lid 210L covers and seals an opening to an interior chamber 210C that contains first robotic arm 212 (first robotic arm 212 is not visible in the view of FIG. 3A). The lid 210L and/or the rim (lid seat) of the opening may include a seal component (e.g., a gasket, an elastomeric O-ring, etc.) to help maintain a sealed environment within the interior chamber 210C (e.g., so that the interior chamber 210C may be maintained under vacuum and/or under different atmospheric conditions from substrate processing chambers 280 and/or the load-lock module 220). The lid 210L of this example further includes additional securing devices 214 that secure to the main body 210A (e.g., through bolted connections) to provide further securing of the lid 210L to the main body 210A. In this illustrated example, the additional securing devices 214 are spaced around the perimeter 210P of the lid 210L. While not a requirement in all examples of this technology, lid 210L of this illustrated example further includes some sealed viewing windows 210W providing visual access to the interior chamber 210C through the top.

Additional features of the lid moving system 300 and its engagement with lid 210L now will be described in more detail in conjunction with FIGS. 3A-3G. This example lid moving system 300 includes a base member 302 (e.g., a rear panel) having a first side 302A (e.g., a right side of center when looking at a major surface 302S of the base member 302—see FIG. 3F) and a second side 302B (e.g., a left side of center when looking at the major surface 302S of the base member 302—see FIG. 3F). A first side wall 304A extends from the first side 302A of the base member 302 (e.g., in a direction toward lid 210L and/or toward lid mounting arm 310 and/or in a direction away from major surface 302S). This first side wall 304A includes a first cam surface 306A defined therein. Similarly, the lid moving system 300 further includes a second side wall 304B extending from the second side 302B of the base member 302 (e.g., in a direction toward lid 210L and/or toward lid mounting arm 310 and/or in a direction away from major surface 302S), and this second side wall 304B also includes a second cam surface 306B defined therein. Base member 302, first side wall 304A, and second side wall 304B of this example are fixedly mounted with respect to (e.g., by a bolted connection) the main body 210A of the substrate handling chamber 210 (e.g., at a location opposite the location of the load-lock module 220). The base member 302, first side wall 304A, and second side wall 304B (optionally together with a top member 304T and/or bottom member 304X) may form a "tower" like structure of the lid moving system 300. The parts forming the "tower" structure may define an interior chamber 304V, e.g., with an open front face, as shown in FIG. 3B. In this illustrated example, the substrate handling chamber 210 has a generally regular pentagonal shape (or at least its gate valve mounting locations are arranged in a pentagonal shape), the load-lock module 220 is coupled to one facet of the pentagonal shape, and the lid moving system 300 (e.g., at least base member 302, first side wall 304A, and second side wall 304B (or the "tower") thereof) is located at a corner of the pentagonal shape directly across the substrate handling chamber 210 from the load-lock module 220. The lid moving system 300, however, could be located at other positions around the substrate handling chamber 210, if desired (e.g., at other corners of the pentagonal shape and/or to enclosures of other shapes).

Lid mounting arm 310 extends in a direction away from the base member 302 (and toward the lid 210L). The lid mounting arm 310 of this illustrated example includes a first arm member 310A at one side and a second arm member 310B at the other side. As shown in FIG. 3B, a base member 318P (e.g., a base plate) extends between the arm members 310A, 310B, and the base member 318P, the first arm member 310A, and/or the second arm member 310B engage a top surface of the lid 210L near a perimeter 210P of the lid 210L, e.g., by bolts. Thus, the lid mounting arm 310 is fixed to the lid 210L (e.g., in a cantilevered arrangement), but the mounting arm 310 is movable with respect to base member 302, first side wall 304A, and second side wall 304B (and with respect to the overall "tower").

As shown in FIGS. 3C 3D, and 3G, a first pivotal connection system 320 engages the first cam surface 306A of the first side wall 304A and the second cam surface 306B of the second side wall 304B. The first pivotal connection system 320 of this example includes one or more axles 320A, 320B (e.g., pins) mounted to or integrally formed with the lid mounting arm 310, e.g., at a coupling 322A, 322B, respectively (e.g., a part forming a mounting hole for an axle). The axle(s) 320A, 320B may be fixed with respect to the lid mounting arm 310 (e.g., fixed with respect to first arm member 310A and second arm member 310B, respectively). The axle(s) 320A, 320B extend into and engage cam surfaces 306A and/or 306B in a manner such that the axle(s) 320A, 320B can slide and rotate within their respective cam surface 306A, 306B. Any type of connection may be used in accordance with this technology. For example, the first arm member 310A may include a coupling 322A that is separate part from the coupling 322B provided on the second arm member 310B, or a single coupling part may be provided (e.g., extending between arm members 310A, 310B). As another example, axle 320A may be a separate part from axle 320B, or axles 320A and 320B may constitute opposite ends of a single axle member. As another example, the axle(s) 320A, 320B may constitute one or more rods that are fixed to or integrally formed at the first end 316 of the first arm member 310A and second arm member 310B and are sized and shaped to permit rotation within cam surfaces 306A, 306B. Alternatively, in some examples, axle(s) 320A, 320B may rotate with respect to coupling(s) 322A, 322B, respectively. In the specific example shown in FIG. 3G, the axles 320A, 320B extend through couplings 322A, 322B, respectively, and into opposite ends of a mount member 316M provided at the first end 316 of the first arm member 310A and second arm member 310B. Mount member 316M in this example includes one or more holes that receive ends of the axle(s) 320A and 320B.

As noted above, the axle(s) 320A and 320B engage cam surfaces 306A and 306B, respectively. The cam surfaces 306A and 306B guide movement of the lid mounting arm 310 and the engaged lid 210L when the lid 210L is moved, as will be described in more detail below. As shown in FIG. 3E along with FIGS. 3C and 3D, in this illustrated example, each of the first cam surface 306A and the second cam surface 306B has a vertical cam segment 306V at a first end thereof and an angled cam segment 306X extending upward and away from the vertical cam segment 306V (and away from the base member 302) to a second end of cam surface 306A, 306B. The "vertical" and "upward" orientations are present when this example lid moving system 300 is mounted on a substrate handling chamber 210 for typical use, e.g., in the manner illustrated in FIGS. 2 and 3A. Thus, the angled cam segments 306X (and the movement of axle(s) 320A, 320B induced by them) include both vertical and horizontal components when the lid moving system 300 is mounted on a substrate handling chamber 210. The vertical cam segment 306V and the angled cam segment 306X define an angle A, as shown in FIG. 3E. Angle A may be an obtuse angle, e.g., within a range of 95 degrees to 150 degrees, and in some examples, within a range of 100 degrees and 140 degrees or within a range of 105 degrees and 130 degrees. In the illustrated example, Angle A is about 120 degrees.

FIGS. 3C, 3D, and 3G further show that this example lid moving system 300 includes a traveler member 330 used to move the lid mounting arm 310 (and the lid 210L attached to it). Traveler member 330 of this example includes a base element 330A. A recess 330R (or opening) is defined in (or through) the base element 330A (or other part of the traveler member 330), e.g., on a surface 332 of the traveler member 330 that directly faces the base member 302. See FIG. 3D. The opening to this recess 330R may be provided at a location on surface 332 offset from a central vertical axis or location of the traveler member 330 (and/or offset from a central vertical axis or location of the base member 302 or "tower"). Further, the base member 302 of this example includes an opening 3020 (e.g., a through hole aperture) that overlaps with (e.g., at least partially aligns in an axial or length direction) with the recess 330R defined in (or through) the base element 330A of traveler member 330 when the traveler member 330 is in a lid open position. As shown in FIG. 3F, the opening 3020 (and recess 330R of traveler member 330) may be offset to one side of the base member 302 (e.g., located within the first side 302A, in this illustrated example). The offset (from center) position of opening 3020 and recess 330R provides additional room for incorporating those features into the lid moving system 300 structures (e.g., offset from a central track or other components on which the traveler 330 moves) and allows easy access to the opening 3020 for inserting a stopper mechanism 360 (described in more detail below).

Traveler member 330 of this example further includes one or more tracking elements 334, e.g., extending outward from each side of the base element 330A. Two tracking elements 334 are shown on each side of traveler member 330 in the example of FIGS. 3C, 3D, and 3G. The tracking elements 334 fit into and engage corresponding tracking slots 304C and 304D defined in first side wall 304A and second side wall 304B, respectively. The tracking slots 304C and 304D and the tracking element(s) 334 extending into (and engaged with) them define a direction of motion of the traveler member 330 when motor 350 moves the traveler member 330 (which in turn, moves the lid mounting arm 310 and the connected lid 210L). The traveler member 330 moves in a vertical direction in this illustrated example (although other orientations are possible). The traveler member 330 may be mounted on a lead screw that rotates (e.g., driven by motor 350 and gear box, driven by a hand crank, etc.) to move the traveler member 330 up and down (with the direction of motion of the traveler member 330 controlled by the tracking elements 334, the tracking slots 304C and 304D, the side walls 304A and 304B, and/or the screw drive).

A second pivotal connection system 340 pivotally engages the traveler member 330 with the lid mounting arm 310. The second pivotal connection system 340 of this example includes one or more axles 340A (or pins) that is/are pivotally (rotatably) mounted to a coupling 340B provided or engaged with the traveler member 330 (e.g., with the axle(s) 340A extending through a portion of traveler member 330 defining an axle mounting hole 330H, shown in FIG. 3G). The axle(s) 340A are fixed with respect to the lid mounting arm 310, and optionally integrally formed as part of the lid mounting arm 310 (e.g., with one axle 340A fixed to first arm member 310A and another axle 340A fixed to second arm member 310B). Alternatively, the axle(s) 340A could be fixed with the traveler member 330 at coupling(s) 340B but rotatable within an axle mounting opening(s) or coupling(s) provided with the lid mounting arm 310.

Any type of connection at the second pivotal connection system 340 may be used in accordance with this technology. For example, the first arm member 310A may include an axle support that is separate part from an axle support provided on the second arm member 310B, or a single axle support may be provided (e.g., extending between arm members 310A, 310B). As another example, a single axle 340A may be provided that engages (or is integrally formed with) both first arm member 310A and second arm member 310B, or separate axle 340A parts may be provided (with one axle 340A provided with first arm member 310A and a separate axle 340A provided with second arm member 310B). The axle(s) 340A and the opening of the coupling(s) 340B may be sized and shaped to permit rotation of the arm members 310A, 310B with respect to the traveler 330 about axle(s) 340A within the opening of the coupling(s) 340B. If necessary or desired, a bearing or other rotation supporting structures may be provided at the rotational engagement location between the axle(s) 340A and the coupling(s) 340B.

Additional details of the specifically illustrated example second pivotal connection system 340 will be described with additional reference to FIG. 3G. As shown, the axle mounting hole 330H of the traveler member 330 is provided at a rotational or pivotal mount area 330P of the traveler member 330. The rotational or pivotal mount area 330P is located opposite and somewhat below surface 332 in this illustrated example, and/or it extends outward and below base element 330A of the traveler member 330. In this illustrated example, as evident from FIG. 3G, the rotational or pivotal mount area 330P extends into a recess or opening 310R defined in a top surface of the lid mounting arm 310 such that axle mounting hole 330H of the traveler member 330 axially aligns with axle holes 310H provided in the lid mounting arm 310 (e.g., with one axle hole 310H provided in first arm member 310A and another axle hole 310H provided in second arm member 310B in this illustrated example). The axle holes 310H open into recess 310R. Axle 340A extends through axle holes 310H of the lid mounting arm 310 and through axle mounting hole 330H of the traveler member 330 to rotatably mount the lid mounting arm 310 with respect to the traveler member 330. Thus, the axle 340A extends through axle holes 310H and through recess 310R (with the axle 340A located inside of axle mounting hole 330H of the traveler member 330 in the recess 310R).

As shown in the example of FIGS. 3D and 3G, the lid mounting arm 310 (e.g., each of first arm member 310A and second arm member 310B) includes or extends to a first end 316 that includes the first pivotal connection system 320. Also, the lid mounting arm 310 (e.g., each of first arm member 310A and second arm member 310B) includes a lid-engaging portion 318 where the lid mounting arm 310 is coupled to the lid 210L (e.g., by bolted connections). In this illustrated example, the second pivotal connection system 340 is spaced from the first end 316 toward the lid-engaging portion 318. In this manner, the lid-engaging portion 318 is located closer to the second pivotal connection system 340 than to the first pivotal connection system 320. The second pivotal connection system 340 may be located at or within the lid-engaging portion 318 in some examples of this technology. As shown in FIG. 3B, the lid-engaging portion 318 of this example includes a base member 318P (e.g., a base plate) extending between the arm members 310A, 310B, and one or more of the base member 318P, the first arm member 310A, and/or the second arm member 310B engages a top surface of the lid 210L, e.g., by bolts.

This example lid moving system 300 further includes a motor 350 for moving the traveler member 330. The motor 350 may move a shaft 352 or other support member that is engaged with the traveler member 330. Movement of the traveler member 330 causes movement of the lid mounting arm 310 with respect to the first side wall 304A and the second side wall 304B (or "tower" structure), as will be discussed in more detail below.

The lid moving system 300 of this example further includes a stopper mechanism 360 to hold the lid 210L in the open position. The stopper mechanism 360 of this illustrated example includes a rod 362 configured to: (i) extend through the opening 3020 (e.g., a through hole aperture) defined through the base member 302 and (ii) removably extend into (or through) the recess 330R (or opening) of the traveler member 330. The stopper mechanism 360 extends into opening 330R from a direction of the surface 332 of the traveler member 330 that faces the base member 302 when the traveler member 330 is at a lid open position, as shown in FIGS. 3C and 3D (and as will be discussed in more detail below). As evident from FIG. 3D, the stopper mechanism 360 extends to contact base member 302 and traveler 330 and prevents the traveler 330 from moving up and down with respect to base member 302.

As shown schematically in FIG. 3B, lid moving systems 300 in accordance with at least some examples of this technology may include one or more heating elements 370. The heating element(s) 370, when present, may be used to heat up the junction between the lid 210L and the lid mounting seat provided on the main body 210A of the substrate handling chamber 210. The heating element(s) 370 can heat the lid 210L and main body 210A to help break the seal between these components as the lid 210L is being lifted (as will be described in more detail below). The heating element(s) 370 may be provided: (i) as part of the lid moving system 300 (e.g., on one or more of the lid mounting arm 310, first arm member 310A, second arm member 310B, base member 318P, first side wall 304A, second side wall 304B, base member 302, or base "tower"); (ii) as part of the lid 210L (e.g., on or at a periphery of the lid 210L); and/or (iii) on the main body 210A of the substrate handling chamber 210. Example heating element 370 locations are shown schematically in FIGS. 3A and 3B.

Figure 4A:
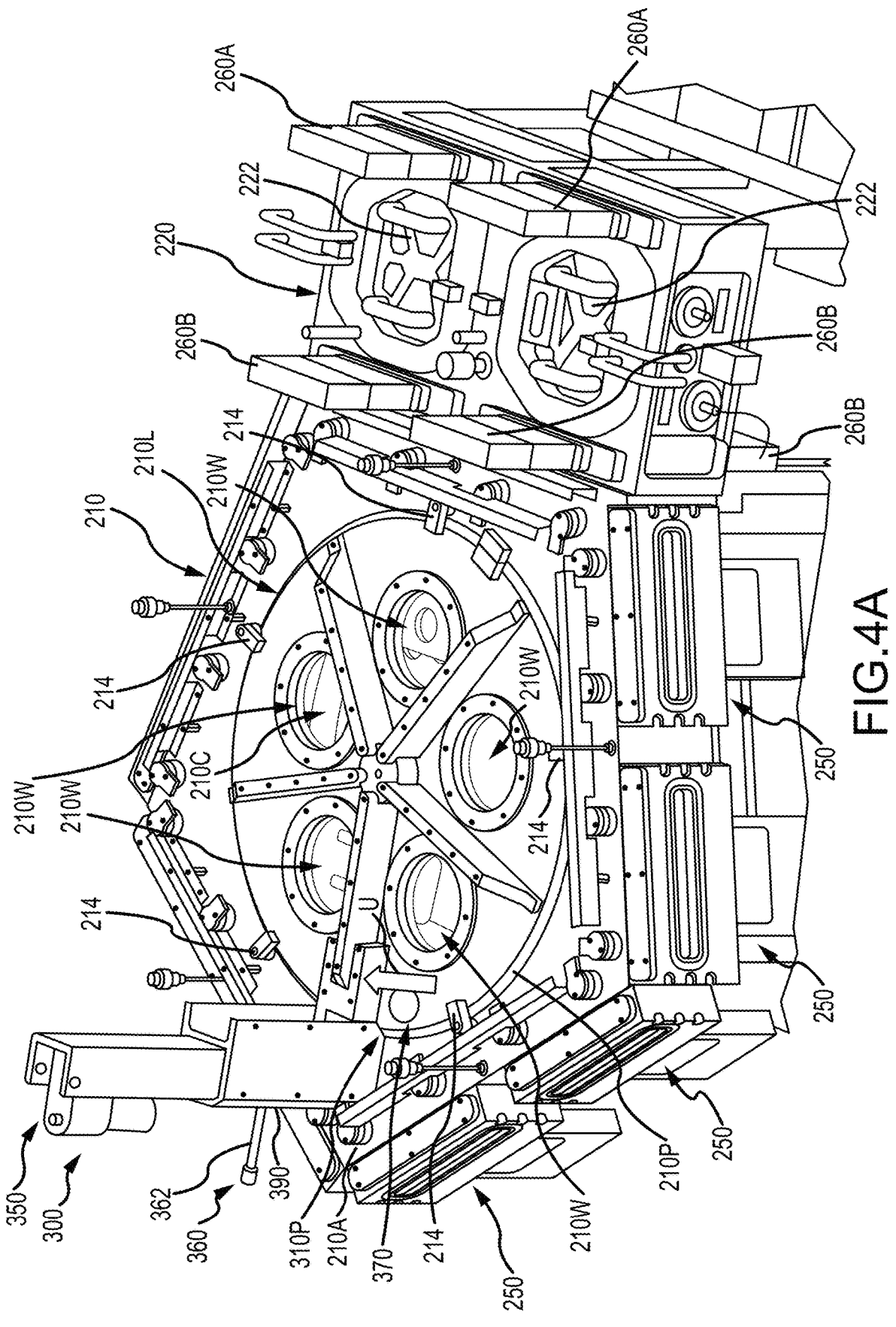
Figure 4D:
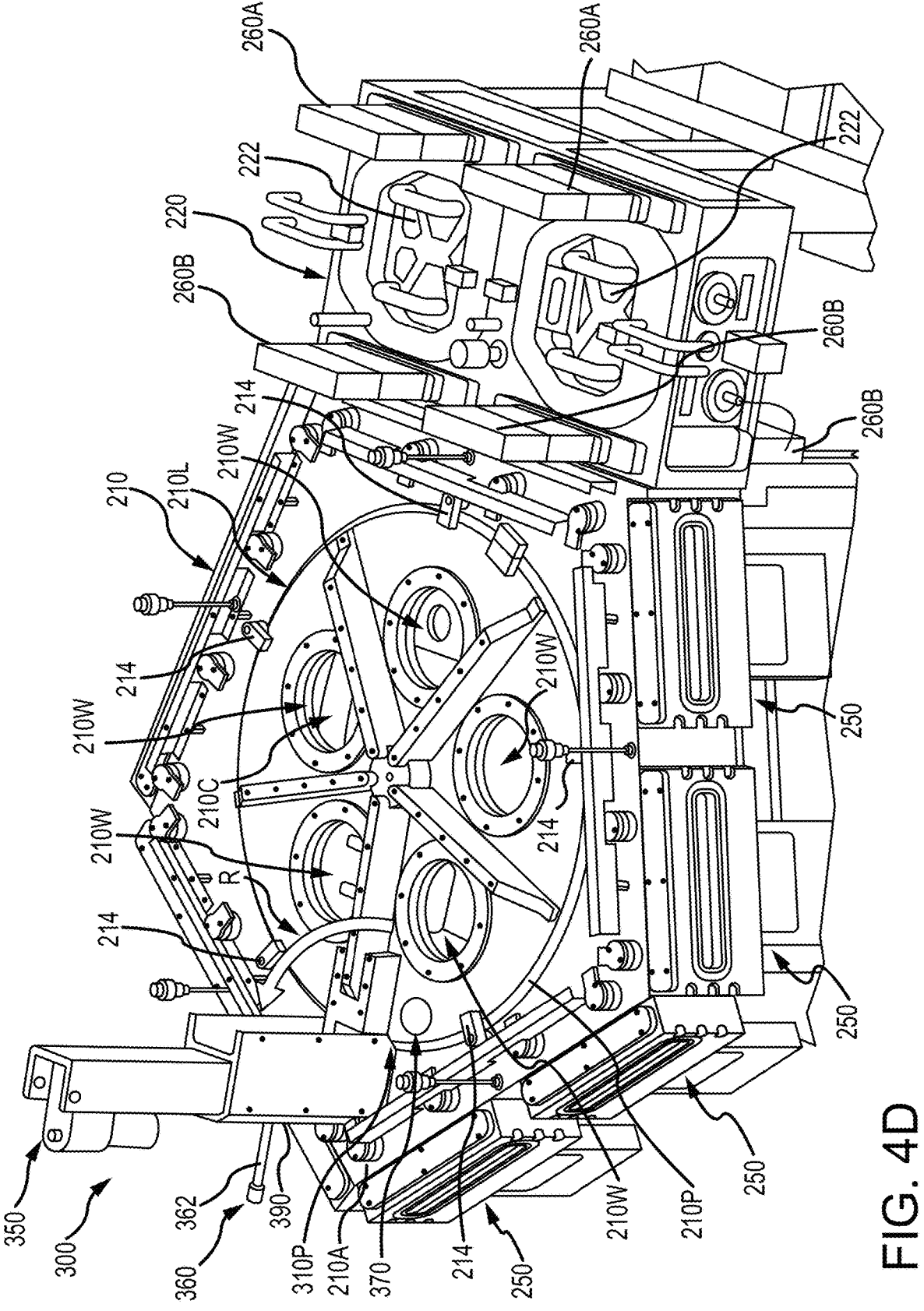

Operation of the lid moving system 300 to move a lid 210L now will be described in more detail with additional reference to FIGS. 4A-4F(2). FIGS. 4A-4C(2) illustrate features of an initial lid lifting phase of a lid moving operation in which the lid moving system 300 initially lifts the lid 210L upward (at least at one outer edge location) until any residual seal between the lid 210L and the main body 210A is unsealed. FIGS. 4D-4F(2) illustrate features of a lid rotational phase of the lid moving operation in which the lid moving system 300 pivots the lid 210L upward and away from the main body 210A about the first pivotal connection system 320 and the second pivotal connection system 340. FIGS. 4B(1), 4C(1), 4E(1), and 4F(1) only show representations of the cam surfaces 306A, 306B; the axle(s) 320A, 320B engaging the cam surfaces 306A, 306B; tracking slots 304C, 304D; and the tracking elements 334 engaging the tracking slots 304C, 304D. FIGS. 4B(2), 4C(2), 4E(2), and 4F(2) show more complete views of the lid moving system 300, its motion, and motion of the lid 210L at the pivotal locations shown in FIGS. 4B(1), 4C(1), 4E(1), and 4F(1), respectively.

To start, as illustrated in FIGS. 2, 3A, 4A, and 4D, a lid moving system 300 is engaged with the lid 210L, e.g., by bolting (or otherwise connecting) the lid 210L with the lid mounting arm 310 of the lid moving system 300 (e.g., at a base member 318P and/or arm members 310A, 310B). This engagement step may be completed during initial manufacture of the substrate handling chamber 210 or, in some examples, the lid moving system 300 may be engaged with a substrate handling chamber 210 and/or lid 210L as an "after market" product or option. The lid moving system 300 may have a structure like that described above, e.g., including:

a) a base member 302 having a major surface 302S that faces in a direction away from the main body 210A of the substrate handling chamber 210 (e.g., the lid moving system 300 potentially having a "tower" structure of the types described above (at least including base member 302, first side wall 304A, and second side wall 304B));

b) a lid mounting arm 310 (e.g., including first arm member 310A and second arm member 310B) extending in a direction away from the base member 302—the lid mounting arm 310 (and its arm members 310A, 310B) may be engaged with the lid 210L at a first outer edge location 310P of the lid 210L, e.g., via base member 318P;

c) a traveler member 330 including a recess 330R or opening on a surface 332 facing the base member 302;

d) a pivotal connection system 340 pivotally engaging the traveler member 330 with the lid mounting arm 310; and e) a motor 350 operatively coupled for moving the traveler member 330.

The lid mounting arm 310 further may be connected by a first pivotal connection system 320 to side walls 304A and 304B extending from the base member 302 and away from its major surface 302S. As will be described in more detail below, movement of the traveler member 330 with respect to the base member 302 causes movement of the lid mounting arm 310 and the lid 210L.

At the start of a lid moving operation, the lid 210L may be sealed to the main body 210A of the substrate handling chamber 210, as shown in FIG. 4A. The substrate handling chamber 210 may be under a vacuum or low pressure condition and/or other atmospheric conditions that differ from the exterior atmospheric conditions. With the lid 210L in the sealed position shown in FIG. 4A: (i) the axles 320A, 320B located at the first end 316 of the mounting arm 310 are positioned at the bottom of the vertical cam segment 306V of cam surfaces 306A, 306B, respectively; and (ii) the tracking elements 334 of the traveler member 330 are positioned toward the bottom of the tracking slots 304C, 304D. See FIGS. 4B(1) and 4B(2).

As an initial step, if present (and needed), any fastening elements securing the lid 210L to the main body 210A of the substrate handling chamber 210 (such as the additional securing devices 214) will be disengaged (so that the lid 210L is no longer fastened to the main body 210A). This step may result in an initial "venting" of the interior chamber 210C (e.g., making the pressure within the interior chamber 210C equal to (or substantially equal to) the exterior environmental pressure conditions). Additionally or alternatively, if needed, a separate "venting" step may be performed (e.g., before additional securing devices 214 are removed) to make the pressure within the interior chamber 210C equal to (or substantially equal to) the exterior environmental pressure conditions.

In some instances, the above described "venting" step(s) alone may not be sufficient to completely unseal the junction between the lid 210L (e.g., its perimeter rim) and the lid-engaging structures (e.g., lid seal seat) provided on the main body 210A of the substrate handling chamber 210. For this reason, lid moving systems 300 and lid moving methods according to at least some aspects of this technology include an initial lid lifting phase in the lid moving operation. In the initial lid lifting phase, the lid moving system 300 initially applies force to lift the lid 210L upward at least at the first outer edge location 310P (which is a location adjacent a place where the lid 210L is engaged with the lid mounting arm 310). See arrow U in FIG. 4A. This initial lid lifting action near the mounting arm 310 pulls the edge of the lid 210L upward at least near the mounting arm 310 to break any residual seal between the lid 210L and the main body 210A. More specifically, in the illustrated example, the motor 350 turns a screw drive on which the traveler member 330 is mounted. This action moves the traveler member 330 upward, which in turn: (a) moves tracking elements 334 upward in tracking slots 304C, 304D and (b) moves axles 320A and 320B upward in the vertical cam segment 306V of the cam surfaces 306A, 306B. Compare FIGS. 4B(1) and 4B(2) with FIGS. 4C(1) and 4C(2) (FIG. 4C(2) shows a small gap G between the bottom of lid 210L and the top surface of the main body 210A of substrate handling chamber 210, whereas FIG. 4B(2) shows an abutting relationship between these parts). The unsealing action may be accompanied with an audible "pop," "hiss," or other sound as the seal is broken and the pressures inside and outside the substrate handling chamber 210 equalize and/or as parts that are stuck together become unstuck (e.g., as the lid 210L lifts from a seal or from the lid seat provided around opening 2100). In some instances, the residual sealing and/or sticking force and the force applied to the lid 210L by the motor 350 lifting the lid mounting arm 310 may be sufficient to somewhat deform (e.g., temporarily bend) the lid 210L, e.g., near the first outer edge location 310P and/or at locations proximate to the attachment of the first arm member 310A, the second arm member 310B, and/or base member 318P to the lid 210L. This deformation, when it occurs, can help break the seal and/or stickiness at or near the first outer edge location 310P and help complete the venting and unsealing processes.

Additionally or alternatively, in at least some examples of this technology, during or prior to the initial "venting" action and/or the initial lid lifting phase, heat (e.g., via heating element(s) 370) may be applied to one or more of: (a) the lid 210L (e.g., at least at or near the first outer edge location 310P); (b) at least a portion of the lid mounting arm 310 (e.g., one or more of first arm member 310A, second arm member 310B, and/or base member 318P); and/or (c) the main body 210A of the substrate handling chamber 210 (e.g., at least at or near the first outer edge location 310P). Such heating may take place prior to and/or while operating the motor 350 to apply the lifting force during the initial lid lifting phase described above.

After the initial lid lifting phase is completed, the motor 350 may continue to move the traveler member 330 upward to apply a rotational force to pivot the lid 210L upward. See arrow R in FIG. 4D. This force rotates the lid 210L on the lid mounting arm 310 in a direction upward and away from the main body 210A of the substrate handling chamber 210 to a "lid open position" (e.g., as shown in FIGS. 3C and 3D). Starting with the axles 320A, 320B and tracking elements 334 at the locations shown in FIGS. 4C(1) and 4C(2), during this lid rotation phase, the motor 350 continues to move the traveler member 330 upward (e.g., by rotating screw drive). This action: (a) moves tracking elements 334 upward in tracking slots 304C, 304D and (b) moves axles 320A and 320B upward and in an angled direction within the angled cam segment 306X of the cam surfaces 306A, 306B. Compare FIGS. 4C(1) and 4C(2) with FIGS. 4E(1) and 4E(2). Because of the pivotal connection system(s) 320 and/or 340, this action also begins to rotate the lid mounting arm 310 and the lid 210L connected to it upward and away from the top surface of the main body 210A of the substrate handling chamber 210.

Continued operation of the motor 350 continues the movement of tracking elements 334 upward in tracking slots 304C, 304D and movement of axles 320A and 320B upward and in an angled direction within the angled cam segment 306X of the cam surfaces 306A, 306B until the lid 210L reaches a lid open position. Compare FIGS. 4E(1) and 4E(2) with FIGS. 4F(1) and 4F(2). One or more sensors may be provided (e.g., limit switches) to generate signals when the lid 210L has reached the lid open position and/or the lid closed position (e.g., upper and lower limit switches). Signals from such sensors may allow an automated control system to automatically stop operation of the motor 350 when the upper limit of rotation (opening the lid 210L) has been reached and/or when the lower limit of rotation (closing the lid) has been reached. The sensor(s) may sense one or more of: location of the traveler member 330; location of tracking elements 334; location of the lid 210L; location of the lid mounting arm 310; location of the first arm member 310A and/or second arm member 310B; location of axle(s) 320A, 320B; contact between a lid 210L part and a main body 210A part; etc. Such sensors and their use for automated motor control (e.g., shut off) are known and commercially available.

FIGS. 3C and 3F schematically illustrate a control panel 390 fixed to the base member 302, operatively coupled to the motor 350 and automated control system, and used to operate the motor 350. In the illustrated arrangement, the control panel 390 is accessible from the rear of the substrate handling chamber 210, optionally from the ground floor (e.g., without the operator having to be on top of the substrate handling chamber 210 and/or on a ladder). The control panel 390 may allow an operator to initiate a "lid opening" process (e.g., via button 390A, see FIG. 3F), a "lid closing" process (e.g., via button 390B), an "emergency stop" process (e.g., via button 390C), and/or other desired functions. The automated control system may include/run software for operation of the lid moving system 300, e.g., initiating lid opening processes; initiating lid closing processes; requiring reversal of the motor 350 when either of the upper and lower limit switches is tripped; recognizing overcurrent states in the event that the motor 350 is actuated when the stopper mechanism 360 is in place; etc. The control panel 390 may include physical buttons or switches, soft buttons or switches, a touch screen, and/or any desired types of controllers or input devices (e.g., a keyboard, a mouse or other pointer devices, etc.).

Once in the lid open position, e.g., the position shown in FIGS. 3C, 3D, 4F(1), and 4F(2), the stopper mechanism 360 (e.g., a hardened steel rod 362) may be inserted into the recess 330R of the traveler member 330. In at least some examples of this technology, the stopper mechanism 360 can be inserted into the recess 330R from the direction of the surface 332 of the traveler member 330 that faces the base member 302. The stopper mechanism 360 may be inserted through an opening 3020 (e.g., a through hole aperture) formed in the base member 302 and then into recess 330R. The illustrated structures and arrangement enable an operator to insert the rod 362 into the opening 3020 and/or recess 330R from a location behind the substrate handling chamber 210 (e.g., the operator need not be on top of the substrate handling chamber 210 and/or on a ladder to insert the stopper mechanism 360). The stopper mechanism 360 forms a releasable and fixed connection between the traveler member 330 and the base member 302 to prevent the traveler member 330 from moving vertically and thus preventing the lid 210L from moving downward from the lid open position. This feature helps assure the lid 210L remains in the open position, e.g., while technicians or others interact with equipment inside the interior chamber 210C of the substrate handling chamber 210 through its top access opening 2100.

To close the lid 210L, the processes described above are reversed. If necessary, the stopper mechanism 360 (e.g., rod 362) is removed from the recess 330R of the traveler member 330 (and optionally pulled out of the opening 3020 of the base member 302). If necessary, the motor 350 may be operated to slightly lift the traveler member 330 (to relieve any pinching or binding force on the stopper mechanism 360 so it can be removed more easily). The motor 350 then is operated to move the traveler member 330 downward. During this phase, operation of the motor 350 moves tracking elements 334 downward in tracking slots 304C, 304D and moves axles 320A and 320B downward and in an angled direction within the angled cam segment 306X of the cam surfaces 306A, 306B. Compare FIGS. 4F(1) and 4F(2) with FIGS. 4E(1) and 4E(2). These actions begin to rotate the lid 210L downward on the lid mounting arm 310 in a direction toward the main body 210A.

Continued operation of the motor 350 to close the lid 210L further moves tracking elements 334 downward in tracking slots 304C, 304D and moves axles 320A and 320B downward and in an angled direction within the angled cam segment 306X of the cam surfaces 306A, 306B until the axles 320A, 320B reach the end of the angled cam segment 306X. Compare FIGS. 4E(1) and 4E(2) with FIGS. 4C(1), and 4C(2). These actions are accompanied with continued downward rotation of the lid 210L. Then, continued operation of the motor 350 to close the lid 210L further moves tracking elements 334 downward in tracking slots 304C, 304D and moves axles 320A and 320B downward within the vertical cam segment 306V of the cam surfaces 306A, 306B, e.g., until the axles 320A, 320B reach the bottom of the vertical cam segment 306V. Compare FIGS. 4C(1) and 4C(2) with FIGS. 4B(1) and 4B(2). This action may trigger sensors of the lower limit switch(es) to automatically stop operation of the motor 350. At this point, the lid 210L is correctly positioned over the access opening 2100 of the main body 210A of the substrate handling chamber 210. If necessary, other lid securing action(s) may be taken (e.g., securing additional securing devices 214), and the substrate handling chamber 210 may be sealed and ready to accommodate a vacuum or other atmospheric environment.

While described above in terms of lid moving systems 300 for substrate handling chambers 210 of cluster type substrate processing systems 200, lid moving systems 300 of the types described herein may be used with removable lids provided with other types of enclosures, such as substrate processing chambers 280; chemical reaction vessels; storage tanks; other containers; etc.

Also, while the above examples utilize a computer-controlled motor 350 to move traveler member 330 upward and downward with respect to side walls 304A, 304B, in some examples of this technology, the motor 350 need not be computer-controlled (e.g., it could be manually controlled) or could be replaced by a hand-operated crank mechanism (e.g., used to turn a screw drive to move the traveler member 330 upward and downward).

Some advantageous features or results that may be realized in at least some examples of this technology include: (a) providing access to the inner faces of the substrate processing 280 modules and/or the load-lock module 220 from above or from within the substrate handling chamber 210; (b) providing lid moving systems 300 with a small footprint, e.g., for use with smaller sized chambers or containers; (c) providing automated systems and methods to better "vent" or unseal a lid 210L before beginning rotation of the lid 210L; (d) limiting movement of the traveler 330, e.g., within a predetermined region defined by the side walls 304A and 304B (e.g., within an interior chamber 304V of a "tower" structure); (e) preventing undesired or unplanned movement of the lid 210L from the lid open position (e.g., due to accidental activation, mechanical failure, etc.); (f) enabling remote operation of the lid moving system 300, e.g., from a ground-based position behind the substrate handling chamber 210; (g) avoiding the need to build a gantry and/or other structure over the substrate handling chamber 210 when lid removal is needed; (h) maintaining the lid 210L securely attached to the lid moving system 300 in a stowed (lid open) position without the need to completely remove the lid 210L from the area of the substrate handling chamber 210; and/or (i) reducing the size of the equipment and/or force needed to move the lid 210L using the initial lid lifting phase (e.g., for venting and/or unsealing) followed by the lid pivot phase, and or using localized heating prior to or during the initial lid lifting phase.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

The invention claimed is:

1. A lid moving system, comprising:

a base member having a first side and a second side;

a first side wall extending from the first side of the base member, the first side wall including a first cam surface defined therein;

a second side wall extending from the second side of the base member, the second side wall including a second cam surface defined therein;

a lid mounting arm extending in a direction away from the base member;

a first pivotal connection system engaging the first cam surface and the second cam surface and pivotally engaging the lid mounting arm;

a traveler member including a recess or opening on a surface facing the base member;

a second pivotal connection system pivotally engaging the traveler member with the lid mounting arm;

a motor for moving the traveler member, wherein movement of the traveler member causes movement of the lid mounting arm with respect to the first side wall and the second side wall; and a stopper mechanism configured to removably extend into the recess or opening of the traveler member from a direction of the surface facing the base member when the traveler member is at a lid open position.

2. The lid moving system according to claim 1, wherein the base member includes a through hole aperture, and wherein the stopper mechanism is removably engageable with the recess or opening of the traveler member through the through hole aperture of the base member when the traveler member is at the lid open position.

3. The lid moving system according to claim 1, further comprising a heating element configured to heat at least a portion of the lid mounting arm.

4. The lid moving system according to claim 1, wherein each of the first cam surface and the second cam surface has a vertical cam segment at a first end and an angled cam segment extending upward and away from the vertical cam segment and away from the base member.

5. The lid moving system according to claim 1, wherein each of the first side wall and the second side wall includes a tracking slot to define a direction of motion for the traveler member, and wherein the traveler member includes one or more tracking elements extending into the tracking slots.

6. The lid moving system according to claim 1, wherein the lid mounting arm includes a first end and a lid-engaging portion, wherein the first pivotal connection system is located at the first end and the second pivotal connection system is spaced from the first end toward the lid-engaging portion.

7. An enclosure, comprising:

a main body member including a top, a bottom, and one or more sidewalls connecting the top and the bottom, wherein the top includes an opening providing access to an internal chamber defined in part by the main body member;

a lid sealingly attachable to the top of the main body member to close the internal chamber; and a lid moving system engaged with the main body member, wherein the lid moving system includes:

a base member having a first side and a second side, wherein the base member includes a surface that faces in a direction away from the main body member, a first side wall extending from the first side of the base member, the first side wall including a first cam surface defined therein, a second side wall extending from the second side of the base member, the second side wall including a second cam surface defined therein, a lid mounting arm extending in a direction away from the base member, wherein the lid mounting arm is engaged with the lid at a first outer edge location of the lid, a first pivotal connection system engaging the first cam surface and the second cam surface and pivotally engaging the lid mounting arm, a traveler member including a recess or opening on a surface facing the base member, a second pivotal connection system pivotally engaging the traveler member with the lid mounting arm, a motor for moving the traveler member, wherein movement of the traveler member causes movement of the lid mounting arm and the lid with respect to the main body member, and a stopper mechanism configured to extend into the recess or opening of the traveler member from a direction of the surface facing the base member when the traveler member is at a lid open position.

8. The enclosure according to claim 7, wherein the base member includes a through hole aperture, and wherein the stopper mechanism is removably engageable with the recess or opening of the traveler member through the through hole aperture of the base member when the traveler member is at the lid open position.

9. The enclosure according to claim 7, further comprising a control system for controlling the motor, wherein the control system generates signals to stop operation of the motor when the lid is at the lid open position.

10. The enclosure according to claim 7, further comprising a heating element configured to heat at least one of (i) the lid at least at the first outer edge location or (ii) at least a portion of the lid mounting arm.

11. The enclosure according to claim 7, wherein each of the first cam surface and the second cam surface has a vertical cam segment at a first end and an angled cam segment extending upward and away from the vertical cam segment and away from the base member.

12. The enclosure according to claim 7, wherein each of the first cam surface and the second cam surface is configured such that, during a lid opening event: (i) the lid moving system initially lifts the lid upward at the first outer edge location until a seal between the lid and the main body member is unsealed and then (ii) the lid pivots upward away from the main body member about the first pivotal connection system and the second pivotal connection system.

13. The enclosure according to claim 7, wherein each of the first side wall and the second side wall includes a tracking slot to define a direction of motion for the traveler member, and wherein the traveler member includes one or more tracking elements extending into the tracking slots.

14. The enclosure according to claim 7, wherein the lid mounting arm includes a first end and a lid-engaging portion, wherein the first pivotal connection system is located at the first end and the second pivotal connection system is spaced from the first end toward the lid-engaging portion.

15. The enclosure according to claim 7, wherein the main body member comprises a substrate handling chamber for moving substrates from the internal chamber to one or more substrate processing chambers.

16. A method of moving a lid with respect to a main body member of an enclosure, the method comprising:

engaging a lid moving system with the lid, wherein the lid moving system includes:

a base member having a surface that faces in a direction away from the main body member, a lid mounting arm extending in a direction away from the base member, wherein the engaging includes engaging the lid mounting arm with the lid at a first outer edge location of the lid, a traveler member including a recess or opening on a surface facing the base member, a pivotal connection system pivotally engaging the traveler member with the lid mounting arm, and a motor for moving the traveler member, wherein movement of the traveler member causes movement of the lid mounting arm and the lid;

operating the motor to initially apply a lifting force to the lid at the first outer edge location;

after the lifting force is applied, operating the motor to apply a rotational force to rotate the lid upward on the lid mounting arm in a direction away from the main body member to a lid open position; and inserting a stopper mechanism into the recess or opening of the traveler member from a direction of the surface facing the base member to prevent the lid from moving from the lid open position.

17. The method according to claim 16, wherein the inserting includes inserting the stopper mechanism through a through hole opening provided in the base member and into the recess or opening of the traveler member.

18. The method according to claim 16, wherein the lifting force breaks a sealed engagement between the lid and the main body member at the first outer edge location.

19. The method according to claim 18, wherein application of the lifting force to break the sealed engagement includes deforming a shape of the lid at the first outer edge location.

20. The method according to claim 16, further comprising heating at least one of (i) the lid at least at the first outer edge location or (ii) at least a portion of the lid mounting arm prior to operating the motor to apply the lifting force.

21. The method according to claim 16, wherein the main body member comprises a substrate handling chamber for moving substrates from the main body member to one or more substrate processing chambers.

22. The method according to claim 16, wherein with the lid starting in the lid open position, the method further comprises:

removing the stopper mechanism from the recess or opening of the traveler member; and operating the motor to initially rotate the lid downward on the lid mounting arm in a direction toward the main body member and then move the lid downward to the main body member.

* * * * *